(12) United States Patent
Taruki et al.

(10) Patent No.: US 6,344,808 B1
(45) Date of Patent: Feb. 5, 2002

(54) MPEG-1 AUDIO LAYER III DECODING DEVICE ACHIEVING FAST PROCESSING BY ELIMINATING AN ARITHMETIC OPERATION PROVIDING A PREVIOUSLY KNOWN OPERATION RESULT

(75) Inventors: Maiko Taruki; Tadashi Sakamoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/441,658

(22) Filed: Nov. 16, 1999

(30) Foreign Application Priority Data

May 11, 1999 (JP) ............................................ 11-129807

(51) Int. Cl.[7] .......................... H03M 7/40; G10C 21/00
(52) U.S. Cl. .......................................... 341/65; 704/501
(58) Field of Search .............................. 341/65, 51, 50, 341/67, 86, 63; 358/432, 261; 708/402; 704/229, 203, 501; 386/111

(56) References Cited

U.S. PATENT DOCUMENTS 5,142,380 A * 8/1992 Sakagami et al. ........... 358/432
6,199,039 B1 * 3/2001 Chen et al. .................. 704/229
6,209,015 B1 * 3/2001 Jhung ......................... 708/402

OTHER PUBLICATIONS

ISO/IEC 11172–3:1993 "Information technology–Coding of moving pictures and associated audio for digital storage media at up to about 1,5 Mbit/s", 1993 ISO/IEC pp. 1–70.

* cited by examiner

Primary Examiner—Patrick Wamsley
(74) Attorney, Agent, or Firm—McDermott, Will & Emery

(57) ABSTRACT

An MPEG-1 audio layer III decoding device, which can perform fast decoding of MP3 by performing fast inverse quantization of Huffman code data, includes a bit stream decomposing portion for decomposing an input bit stream of MP3 into side information including bit allocation information and Huffman table information, a scale factor and Huffman code data; a scale factor decoder for decoding the scale factor decomposed from the bit-stream based on the side information; a Huffman decoder for decoding the Huffman code data decomposed from the bit-stream based on the Huffman table information included in the side information; a zero detecting portion for detecting a band of the Huffman code data all providing values of zero; an inverse quantizer for performing inverse quantizing processing on the Huffman code data based on the output of the zero detecting portion, the side information, the scale factor and the Huffman code data; and a hybrid filter bank portion for inversely mapping and decoding the output of the inverse quantizer into a time region signal.

27 Claims, 18 Drawing Sheets

MPEG-1 AUDIO LAYER III DECODING DEVICE ACHIEVING FAST PROCESSING BY ELIMINATING AN ARITHMETIC OPERATION PROVIDING A PREVIOUSLY KNOWN OPERATION RESULT

BACKGROUND OF THE INVENTION

1. Field of the Invention

The present invention relates to an MPEG (Moving Picture Experts Group)-1 audio layer III decoding device, and particularly an MPEG-1 audio layer III capable of fast decoding processing.

2. Description of the Background Art

The MPEG audio is ISO/IEC (International Organization for Standardization and International Electrotechnical Commission) standards of stereo-audio coding with high quality and high efficiency, and is standardized in parallel with coding of motion pictures in MPEG. As a result, products relating to MPEG audio products have recently been developed.

A bit stream of the MPEG audio is formed of frames. Each frame is a minimum unit of data which allows decoding to an audio signal by itself, and always contains a constant sample number of data.

Referring to FIG. 1, a frame is formed of a header 1, an error check 2, audio data 3 and an ancillary data (external data) 4. Header 1 is a bit stream portion including information such as a synchronization word, a sampling frequency, a bit rate and others. Error check 2 is optional data, and is a bit stream portion including information for error detection. Audio data 3 is a bit stream portion including information related to an audio sample. Ancillary data 4 is a portion into which data other than MPEG audio can be arbitrarily inserted.

In the MPEG-1 audio layer III, which will be referred to as "MP3" hereinafter, each frame includes 1152 sample data. Each frame including 1152 samples is divided into two granules each including 576 samples.

A breakdown of the 576 samples is as follows. For coding of MP3, an input signal is divided by a sub-band analyzing filter bank into 32 frequency bands based on time regions. The output of each band sent from the filter bank is 18 samples (this kind of output will also be represented as a "a long block" hereinafter), or 6×3 samples (this kind of output will also be referred to as a "short block" hereinafter). Then, each band is mapped to subdivided spectral lines by Modified Discrete Cosine Transform (which will be referred to as "MDCT" hereinafter). Frequency region samples of 18 or 6×3=18 are obtained as the output of MDCT. Accordingly, the frequency resolution is equal to 32 bands×18 samples= 576 samples (each sample has an arbitrary data length).

Referring to FIG. 2, a decoder of audio data portion 3 in MP3 includes a bit stream decomposing portion 5 which decomposes the input bit string into side information 6 including bit allocation information and Huffman table information, a scale factor and Huffman code data, a scale factor decoder 7 which is connected to bit stream decomposing portion 5, and decodes the scale factor decomposed from the bit-stream based on side information 6, a Huffman decoder 8 which is connected to bit stream decomposing portion 5, and decodes Huffman code data decomposed from the bit-stream based on Huffman table information included in side information 6, an inverse quantizer 9 which is connected to bit stream decomposing portion 5, scale factor decoder 7 and Huffman decoder 8, and performs inverse quantization of the Huffman code data based on side information 6, scale factor and Huffman code data, and a HFB (Hybrid Filter Bank) 10 which is connected to inverse quantizer 9 and inversely maps the output of inverse quantizer 9 to reconstruct a time region signal.

HFB 10 includes a butterfly operating portion 11 which is connected to inverse quantizer 9, and conducts a butterfly operation or computation on the inversely quantized signal issued from inverse quantizer 9, an IMDCT operating portion 12 which is connected to butterfly operating portion 11, and conducts inverse MDCT (which will be referred to as "IMDCT" hereinafter) on the operation result of butterfly operating portion 11, and a sub-band composing portion 13 which is connected to IMDCT operating portion 12, and conducts sub-band composing processing on the operation result of IMDCT operating portion 12 using Polyphase Filter Bank (which will be referred to as "PFB" hereinafter).

Referring to FIG. 3, respective portions of the decoder for audio data portion 3 of MP3 operate as follows. In the following description, lengths of data to be handled are not restricted. Bit stream decomposing portion 5 extracts and analyzes header 1 of the received bit string (S14). Bit stream decomposing portion 5 decodes the side information 6, and extracts the Huffman code data and scale factor decomposed from the bit-stream (S15). Scale factor decoder 7 decodes the scale factor decomposed from the bit-stream based on side information 6 (S16). Huffman decoder 8 decodes the Huffman code data decomposed from the bit-stream based on the Huffman table information included in side information 6 (S17). As a result of decoding of the Huffman code data, the Huffman code data of 576 in number are decoded per granule. This number depends on the frequency resolution power.

Inverse quantizer 9 performs the inverse quantization of the Huffman code data based on side information 6, scale factor and Huffman code data (S18). The inverse quantization of the Huffman code data is performed according to the following formula (1):

$$Xr(i, j) = \text{sign}(is(i, j)) \times is(i, j) \times 2^P, \ 0 \leq i \leq 31, \ 0 \leq j \leq 17 \quad (1)$$

where Xr(i, j) represents a result of the inverse quantization, is(i, j) represents the Huffman code data, P represents a constant obtained from side information 6 and the scale factor, and sign(a) represents the sign of "a". Further, i represents the subband band number, and j represents the sample number of each subband output.

Butterfly operating portion 11 included in HFB 10 performs the butterfly operation between the sample data of 32 bands issued from inverse quantizer 9, using 8 samples near the band boundary at a time (S19). More specifically, the operation is performed according to the following formula (2):

```
for(i = 0; i < 31; i++)
   for(j = 0; j < 8; j++){
      X(i, 17 – j) = Xr(i, 17 – j)Cs(j) – Xr(i + 1, j)Ca(j);
      X(i + 1, j) = Xr(i + 1, j)Cs(j) + Xr(i, 17 – j)Ca(j);
   }
```

In the formula (2), X(i, j) represents a result of the butterfly operation, and Cs(j) and Ca(j) represent constants determined for the sample numbers, respectively. As to X(i, i) not computed in formula (2), Xr(i, j) is substituted.

IMDCT operating portion 12 obtains data of N samples by folding back the coded N/2 samples, and then performs the inverse transformation (S20). The IMDCT processing for the sample band number i is performed according to the following formulas (3) and (4):

$$Z_i(n) = \sum_{k=0}^{N/2-1} X(i,k) * C(n,k), \quad 0 \le n \le N-1 \quad (3)$$

where $$C(n,k) = \cos\left(\frac{\pi}{2N}(2n+1+\frac{N}{2})(2k+1)\right) \quad (4)$$

where $Z_i(n)$ represents the intermediate result. N is a constant, and is equal to 36 in the case of the long block. In the case of the short block, N is equal to 12. In the processing at step S20, windowing processing is simultaneously performed according to the following formula (5):

$$H_i(n) = Z_i(n) \times W(n) \quad (5)$$

where $H_i(n)$ represents the result of window operation, and W(n) represents a window coefficient. Processing for overlapped portions is conducted on $H_i(n)$, whereby the outputs of 18 samples Y(i, j) ($0 \le j \le 17$) are obtained as the final outputs with respect to each band i. Hereinafter, the output of IMDCT operating portion 12 with respect to X(i, j) ($0 \le i \le 31$, $0 \le j \le 17$) is defined as Y(i, j).

Subband composing portion 13 performs subband composition using PFB, and issues PCM (Pulse Code Modulation) data (i.e., reproduced sample data) which is time region signals (S22).

Referring to FIG. 4, detailed description will be given on subband composing processing (S21 in FIG. 3) which is executed in subband composing portion 13 for obtaining the time region signals of 32 samples. The subband composition is achieved by 512-tap PFB. The subband inputs of 32 samples are defined as $S_j(i) = Y(i, j)$ ($0 \le i \le 31$, j: arbitrary sample number) (S23). For calculating the vector V(m) ($0 \le m \le 63$) for $S_j(i)$, values in vector V(m) ($0 \le m \le 1024$, initial value is 0), which are stored in V(0)–V(959) by performing the PFB processing several times, are moved to storage positions of V(64)–V(1023), respectively. Thus, data of V(960)–V(1023) are erased. Then, vector V(m) for $S_j(i)$ is calculated in accordance with the following formula (6) (S25). N(m, i) is a constant determined by values m and i. Then, 512 data are taken out from V(m) ($0 \le m \le 1024$), and are stored in variables U(k) (k: 0–511) (S26). From calculation of the formula (7) with U(k), 32 reproduced sample data (time region signals) are obtained (S27).

$$V(m) = \sum_{i=0}^{31} N(m,i) S_j(i), \quad 0 \le m \le 63 \quad (6)$$

$$out(i) = \sum_{m=0}^{15} U(i+32m) D(i+32m), \quad 0 \le i \le 31 \quad (7)$$

where D(k) (k: 0–511) is a window function, and out(i) is reproduced sample data. Subband composing portion 13 conducts the processing from S23 to S27 on each of the 18 samples ($0 \le j \le 17$).

As described above, the arithmetic operations used for MP3 decoding are primarily multiplication and production-sum operations. In particular, the IMDCT processing and the subband composing processing using PFB require a large amount of operations for each processing, and the product-sum operations occupy a major part of the required operations. The above processing is performed many times for each granule. Therefore, the above two kinds of processing consume a major part of the decode processing time, and reduction in processing time has been required.

SUMMARY OF THE INVENTION

The invention has been developed for overcoming the above disadvantages, and it is an object of the invention to provide an MPEG-1 audio layer III (MP3) decoding device which can perform fast decoding of MP3 by performing fast inverse quantization of Huffman code data.

Another object of the invention is to provide an MPEG-1 audio layer III decoding device which can perform fast decoding of MP3 by performing fast butterfly operation with respect to inverse quantization signal.

Still another object of the invention is to provide an MPEG-1 audio layer III decoding device which can perform fast decoding of MP3 by performing fast IMDCT processing.

Yet another object of the invention is to provide an MPEG-1 audio layer III decoding device which can perform fast decoding of MP3 by performing fast subband composing processing using PFB.

According to an aspect of the invention, an MPEG-1 audio layer III decoding device includes a bit stream decomposing portion for decomposing an input bit stream of MPEG-1 audio layer III into side information including bit allocation information and Huffman table information, a scale factor and Huffman code data; a scale factor decoder connected to the bit stream decomposing portion, for decoding the scale factor decomposed from the bit-stream based on the side information; a Huffman decoder connected to the bit stream decomposing portion, for decoding Huffman code data decomposed from the bit-stream based on the Huffman table information included in the side information; a zero detecting portion connected to the Huffman decoder, for detecting a band of the Huffman code data all providing values of zero; an inverse quantizer connected to the Huffman decoder, the zero detecting portion, the bit stream decomposing portion and the scale factor decoder, for performing inverse quantizing processing on the Huffman code data based on the output of the zero detecting portion, the side information, the scale factor and the Huffman code data; and a hybrid filter bank portion connected to the inverse quantizer, for inversely mapping the output of the inverse quantizer to decode into a time region signal.

The inverse quantizer can eliminate the inverse quantizing processing for the band of the Huffman code data all providing the values of zero in the zero detecting portion. Therefore, the inverse quantizing processing can be executed fast. Thereby, decoding of the audio data portion of MP3 can be performed fast.

Preferably, the zero detecting portion includes a first zero detector connected to the Huffman decoder, for detecting the band of the Huffman code data all providing the values of zero; and a second zero detector connected to the Huffman decoder, for detecting a band of the Huffman code data not coded in MPEG-1 audio layer III.

Further preferably, the hybrid filter bank portion includes a butterfly operating portion connected to the inverse quantizer, for performing a butterfly operation on the inversely quantized signal issued from the inverse quantizer; an inverse modified discrete cosine transforming portion connected to the butterfly operating portion, for performing inverse modified discrete cosine transform processing on an operation result of the butterfly operating portion, and a subband composing portion connected to the inverse modified discrete cosine transforming portion, for performing subband composing processing using a polyphase filter bank on the operation result of the inverse modified discrete cosine transforming portion.

According to another aspect of the invention, an MPEG-1 audio layer III decoding device includes a bit stream decomposing portion for decomposing an input bit stream of MPEG-1 audio layer III into side information including bit allocation information and Huffman table information, a scale factor and Huffman code data; a scale factor decoder connected to the bit stream decomposing portion, for decoding the scale factor decomposed from the bit-stream based on the side information; a Huffman decoder connected to the bit stream decomposing portion, for decoding the Huffman code data decomposed from the bit-stream based on the Huffman table information included in the side information; a fast zero detector connected to the Huffman decoder, for detecting a band of the Huffman code data not coded in MPEG-1 audio layer III; an inverse quantizer connected to the Huffman decoder, the bit stream decomposing portion and the scale factor decoder, for performing inverse quantizing processing on the Huffman code data based on the side information, the scale factor and the Huffman code data; and a hybrid filter bank portion connected to the first zero detector and the inverse quantizer, for inversely mapping the output of the inverse quantizer to decode into a time region signal in accordance with the output of the first zero detector.

The hybrid filter bank portion can eliminate the inverse mapping of the output of the inverse quantizer for the band not coded in MP3 and detected by the first zero detector. Therefore, the inverse quantizing processing can be executed fast. Thereby, decoding of the audio data portion of MP3 can be performed fast.

Preferably, the hybrid filter bank portion includes a butterfly operating portion connected to the first zero detector and the inverse quantizer, for performing a butterfly operation on the inversely quantized signal issued from the inverse quantizer in accordance with the output of the first zero detector; an inverse modified discrete cosine transforming portion connected to the butterfly operating portion, for performing inverse modified discrete cosine transform processing on the operation result of the butterfly operating portion, and a subband composing portion connected to the inverse modified discrete cosine transforming portion, for performing subband composing processing using a polyphase filter bank on the operation result of the inverse modified discrete cosine transforming portion.

The butterfly operating portion can eliminate the butterfly operation on the inversely quantized signal for the band not coded in MP3 and detected by the first zero detector. Therefore, the butterfly operation can be executed fast. Thereby, decoding of the audio data portion of MP3 can be performed fast.

Further preferably, the hybrid filter bank portion includes a butterfly operating portion connected to the inverse quantizer, for performing a butterfly operation on the inversely quantized signal issued from the inverse quantizer; an inverse modified discrete cosine transforming portion connected to the first zero detector and the butterfly operating portion, for performing inverse modified discrete cosine transform processing on the operation result of the butterfly operating portion in accordance with the output of the first zero detector; and a subband composing portion connected to the inverse modified discrete cosine transforming portion, for performing subband composing processing using a polyphase filter bank on the operation result of the inverse modified discrete cosine transforming portion.

The inverse modified discrete cosine transforming portion can eliminate the inverse modified discrete cosine transforming operation on the butterfly operation result for the band not coded in MP3 and detected by the first zero detector. Therefore, the inverse modified discrete cosine transforming operation can be executed fast. Thereby, decoding of the audio data portion of MP3 can be performed fast.

Further preferably, the hybrid filter bank portion includes a butterfly operating portion connected to the inverse quantizer, for performing a butterfly operation on the inversely quantized signal issued from the inverse quantizer; an inverse modified discrete cosine transforming portion connected to the butterfly operating portion, for performing inverse modified discrete cosine transform processing on the operation result of the butterfly operating portion; and a subband composing portion connected to the first zero detector and the inverse modified discrete cosine transforming portion, for performing subband composing processing on the operation result of the inverse modified discrete cosine transforming portion using a polyphase filter bank in accordance with the output of the first zero detector.

The subband composing processing portion can eliminate the subband composing processing using the polyphase filter bank on the operation result of inverse modified discrete cosine transforming operation for the band not coded in MP3 and detected by the first zero detector. Therefore, the subband composing processing operation can be executed fast. Thereby, decoding of the audio data portion of MP3 can be performed fast.

According to yet another aspect of the invention, an MPEG-1 audio layer III decoding device includes a bit stream decomposing portion for decomposing an input bit stream of MPEG-1 audio layer III into side information including bit allocation information and Huffman table information, a scale factor and Huffman code data; a scale factor decoder connected to the bit stream decomposing portion for decoding the scale factor decomposed from the bit-stream based on the side information; a Huffman decoder connected to the bit stream decomposing portion, for decoding the Huffman code data decomposed from the bit stream based on the Huffman table information included in the side information; an inverse quantizer connected to the Huffman decoder, the bit stream decomposing portion and the scale factor decoder, for performing inverse quantizing processing on the Hoffman code data based on the side information, the scale factor and the Huff-man code data; a butterfly operating portion connected to the inverse quantizer, for performing a butterfly operation on the inversely quantized signal issued from the inverse quantizer; an inverse modified discrete cosine transforming portion connected to the butterfly operating portion, for performing inverse modified discrete cosine transform processing on the operation result of the butterfly operating portion; and a subband composing portion connected to the inverse modified discrete cosine transforming portion, for performing subband composing processing using a polyphase filter bank on the operation result of the inverse modified discrete cosine transforming portion, wherein the inverse modified discrete cosine transforming portion includes a cumulative sum calculating portion connected to the butterfly operating portion, receiving the operation result of the butterfly operating portion, calculating a predetermined number of cumulative sums each formed of products of the operation results and a predetermined coefficient, and obtaining another predetermined number of cumulative sums from the predetermined number of cumulative sums, absolute values of the another predetermined number of cumulative sums is equal to absolute values of the predetermined number of cumulative sums, respectively, and a window function processing portion connected to the cumulative sum calculating portion for multiplying each of the cumulative sums with a window function selected in accordance with a predetermined rule.

In the operation of obtaining the cumulative sums of the products of the operation results and the predetermined coefficient, the inverse modified discrete cosine transforming portion eliminates the arithmetic operation when it is already determined that the absolute value of the cumulative sum will be equal to the absolute value of the previously obtained cumulative sum. Therefore, the inverse modified discrete cosine transforming processing can be executed fast. Thereby, decoding of the audio data portion of MP3 can be performed fast.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
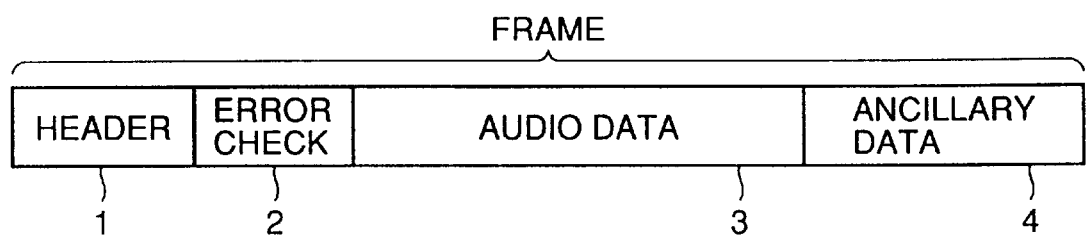
FIG. 1 shows a structure of a frame of MP3.
Figure 5:
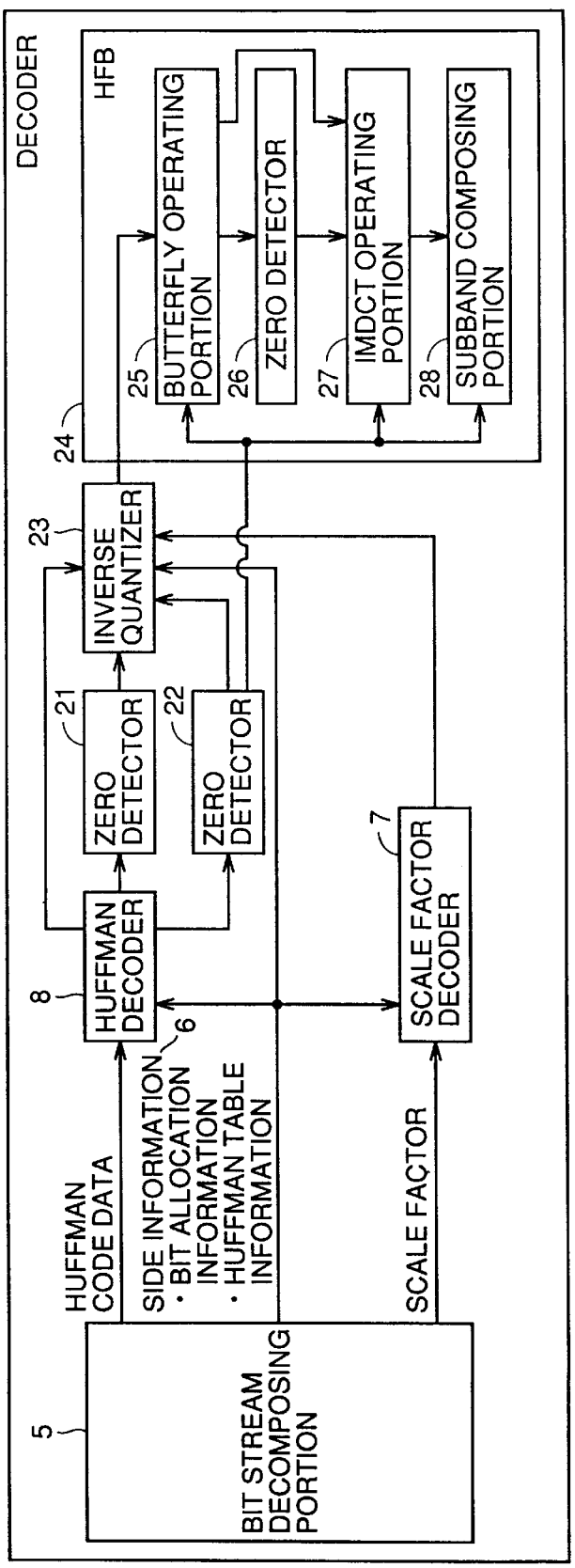
FIG. 5 is a block diagram showing a structure of a decoder for an audio data portion of MP3 according to a first embodiment of the invention.

Referring to FIG. 5, description will be given on a decoder for an audio data portion of MP3 according to a first embodiment of the invention. A bit stream of MP3 is the same as that in the prior art which is already described with reference to FIG. 1, and therefore will not be described below.

Referring to FIG. 5, a decoder of audio data portion 3 in MP3 includes a bit stream decomposing portion 5 which decomposes the input bit string into side information 6 including bit allocation information and Huffman table information, a scale factor and Huffman code data, a scale factor decoder 7 which is connected to bit stream decomposing portion 5, and decodes the scale factor decomposed from the bit-stream based on side information 6, a Huffman decoder 8 which is connected to bit stream decomposing portion 5, and decodes Huffman code data decomposed from the bit-stream based on Huffman table information included in side information 6, a zero detector 21 which is connected to Huffman decoder 8, and detects a band of the Huffman code data, all of which provide the values of zero, a zero detector 22 which is connected to Huffman decoder 8 for detecting a band in which coding of MP3 is not performed, an inverse quantizer 23 which is connected to Huffman decoder 8, zero detectors 21 and 22, bit stream decomposer 5 and scale factor decoder 7, and performs inverse quantization of the Huffman code data based on the outputs of zero detectors 21 and 22, the scale factor and Huffman code data, and an HFB 24 which is connected to zero detector 22 and inverse quantizer 23 for inversely mapping and thereby decoding the output of inverse quantizer 23 into a time region signal in accordance with the output of zero detector 22.

HFB 24 includes a butterfly operating portion 25 which is connected to zero detector 22 and inverse quantizer 23 for performing a butterfly operation on the inversely quantized signal issued from inverse quantizer 23 in accordance with the output of zero detector 22, a zero detector 26 which is connected to butterfly operating portion 25 for detecting the band in the result of operation of butterfly operating portion 25 providing the values all equal to zero, an IMDCT operating portion 27 which is connected to butterfly operating portion 25 as well as zero detectors 26 and 22 for performing IMDCT processing on the operation result of butterfly operating portion 25 in accordance with the outputs of zero detectors 26 and 22, and a subband composing portion 28 which is connected to zero detector 22 and IMDCT operating portion 27 for performing subband composition using PFB on the operation result of IMDCT operating portion 27.

Figure 3:
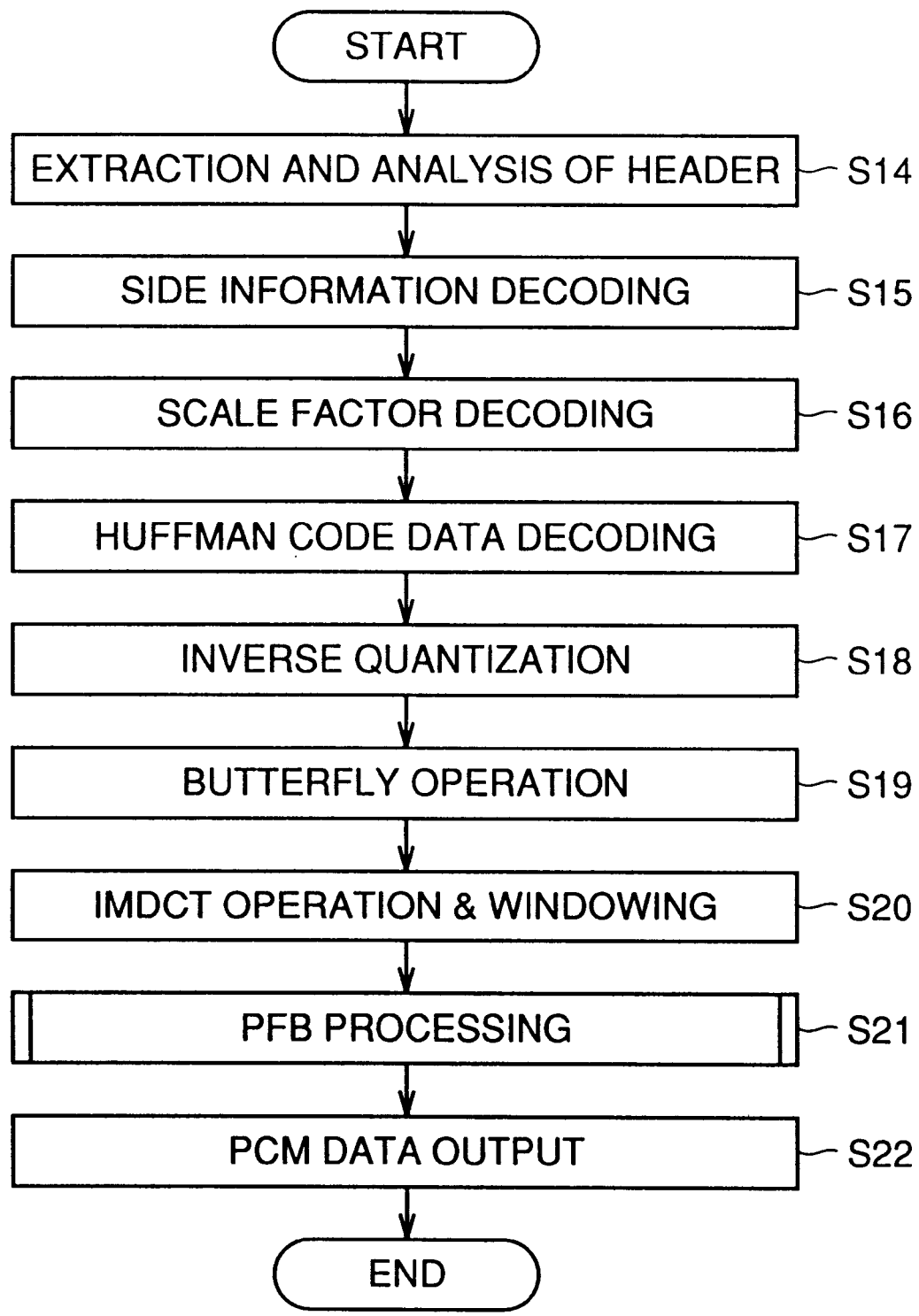
FIG. 3 is a flowchart showing processing of decoding the audio data portion of MP3 in the prior art.
Figure 4:
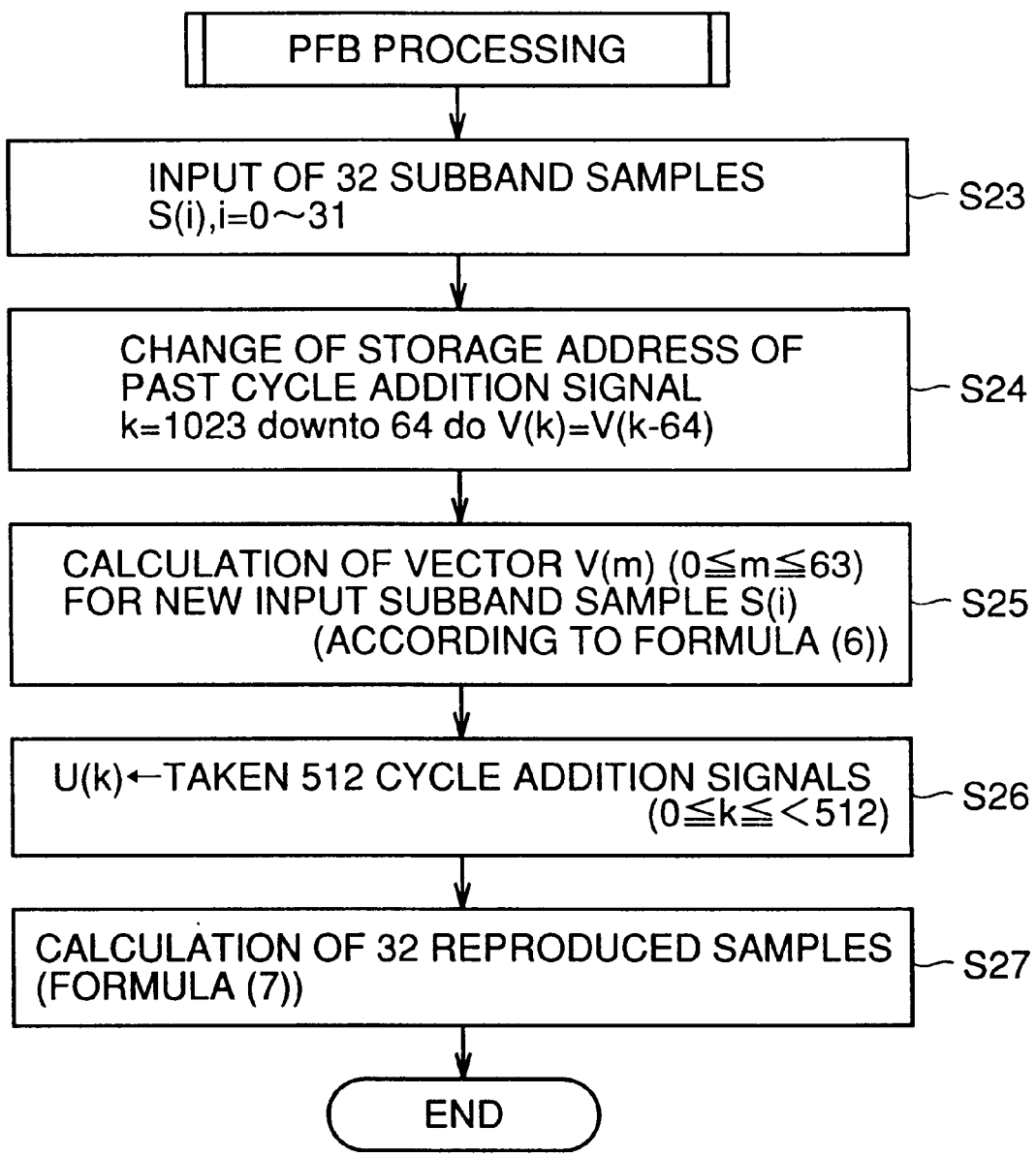
FIG. 4 is a flowchart showing subband composing processing in a subband composing portion 13.
Figure 6:
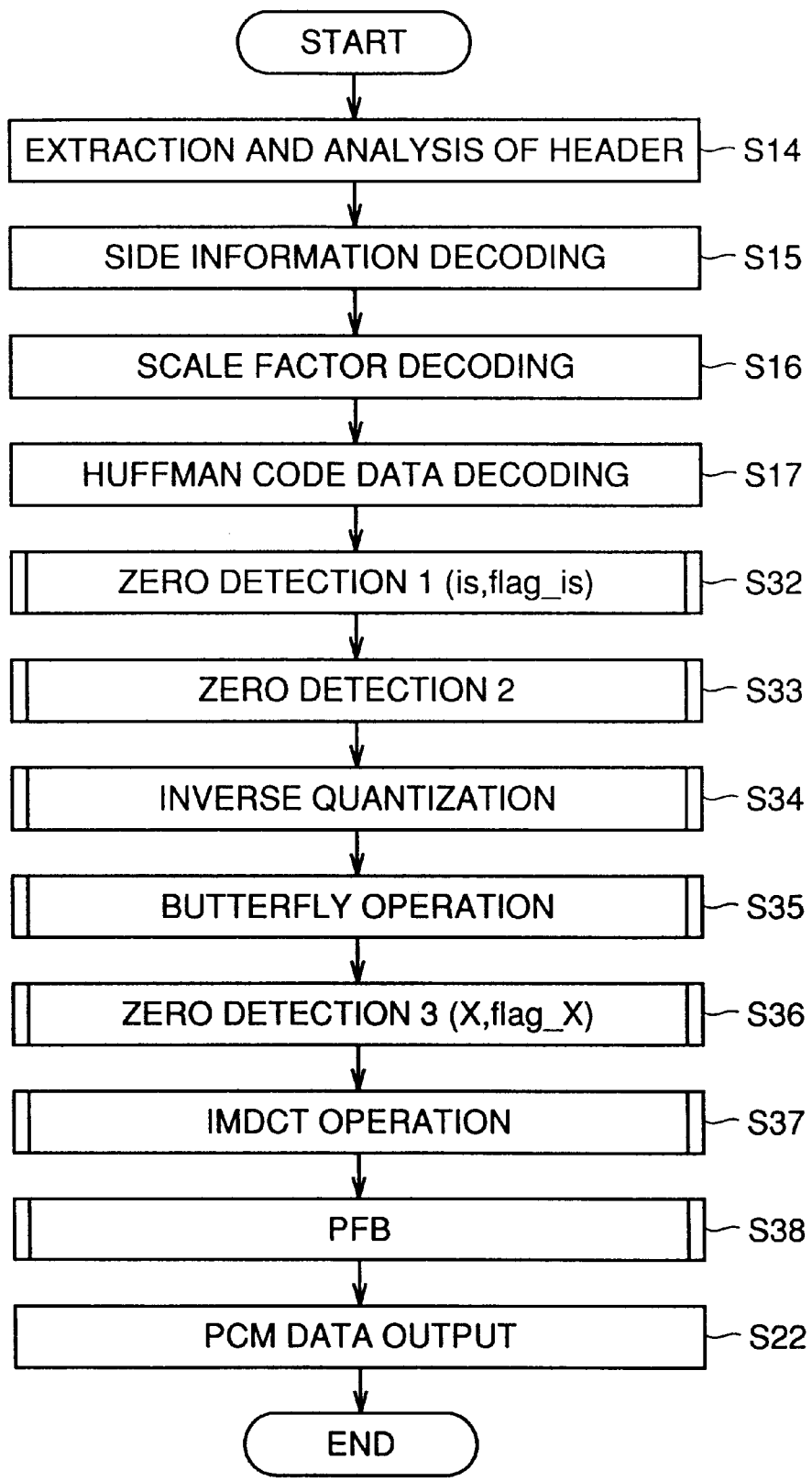
FIG. 6 is a flowchart showing decoding processing for the audio data portion of MP3 according to the first embodiment.

Referring to FIG. 6, respective portions of the decoder for the audio data portion 3 of MP3 operate as follows. Bit stream decomposing portion 5, scale factor decoder 7 and Huffman decoder 8 operate in a manner similar to the processing manner of the conventional decoder already described with reference to FIG. 3, and perform extraction and analysis of the input bit string, decoding of side information 6, decoding of the scale factor and decoding of the Huffman code data (S14–S17).

Zero detector 21 receives the Huffman code data from Huffman decoder 8, and detects a band of the Huffman code data, in which all the values are equal to zero (S32). Zero detector 22 receives the Huffman code data from Huffman decoder 8, and detects a band in which coding of MP3 is not performed (S33). Inverse quantizer 23 inversely quantizes the Huffman code data based on the result of operation in steps S32 and S33 (S34). Butterfly operating portion 25 performs the butte-fly operation on the result of the inverse quantization obtained in step S34 based on the result of processing in step S33 (S35). Zero detector 26 receives the result of the butterfly operation, and detects the band in which all the values of the result of the butterfly operation are equal to zero (S36). IMDCT operating portion 27 performs the IMDCT processing in accordance with the result of processing in steps S33 and S36 (S37). Subband composing portion 28 performs the subband composition using PFB on the operation result of IMDCT operating portion 27 based on the result of processing in step S33 (S38), and issues PCM data (reproduced sample data) which is a time region signal (S22).

Processing from step S32 to step 38 will be successively described in greater detail with reference to the drawings.

Figure 7:
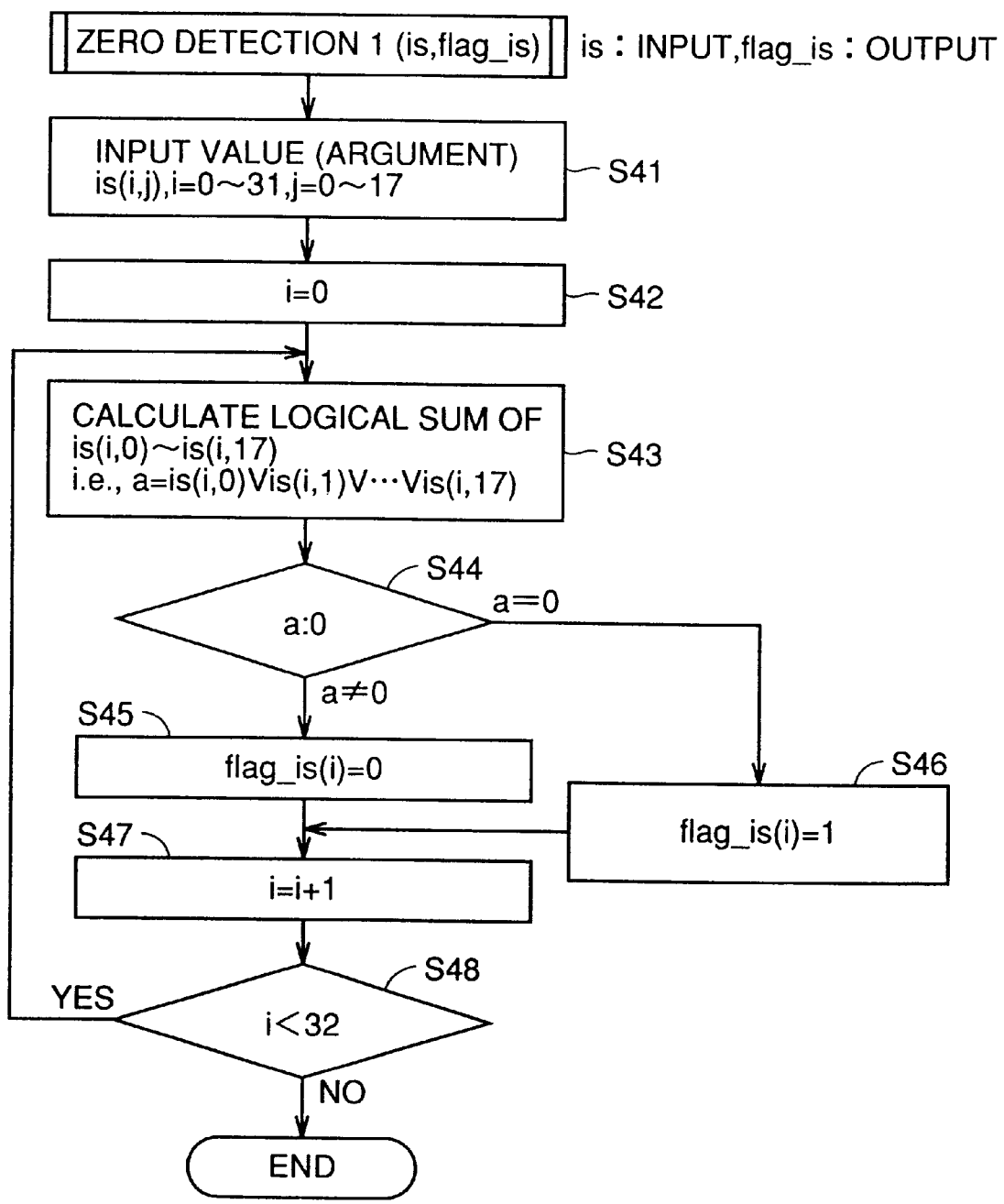
FIG. 7 is a flowchart showing zero detecting processing by a zero detector 21.
Figure 8:
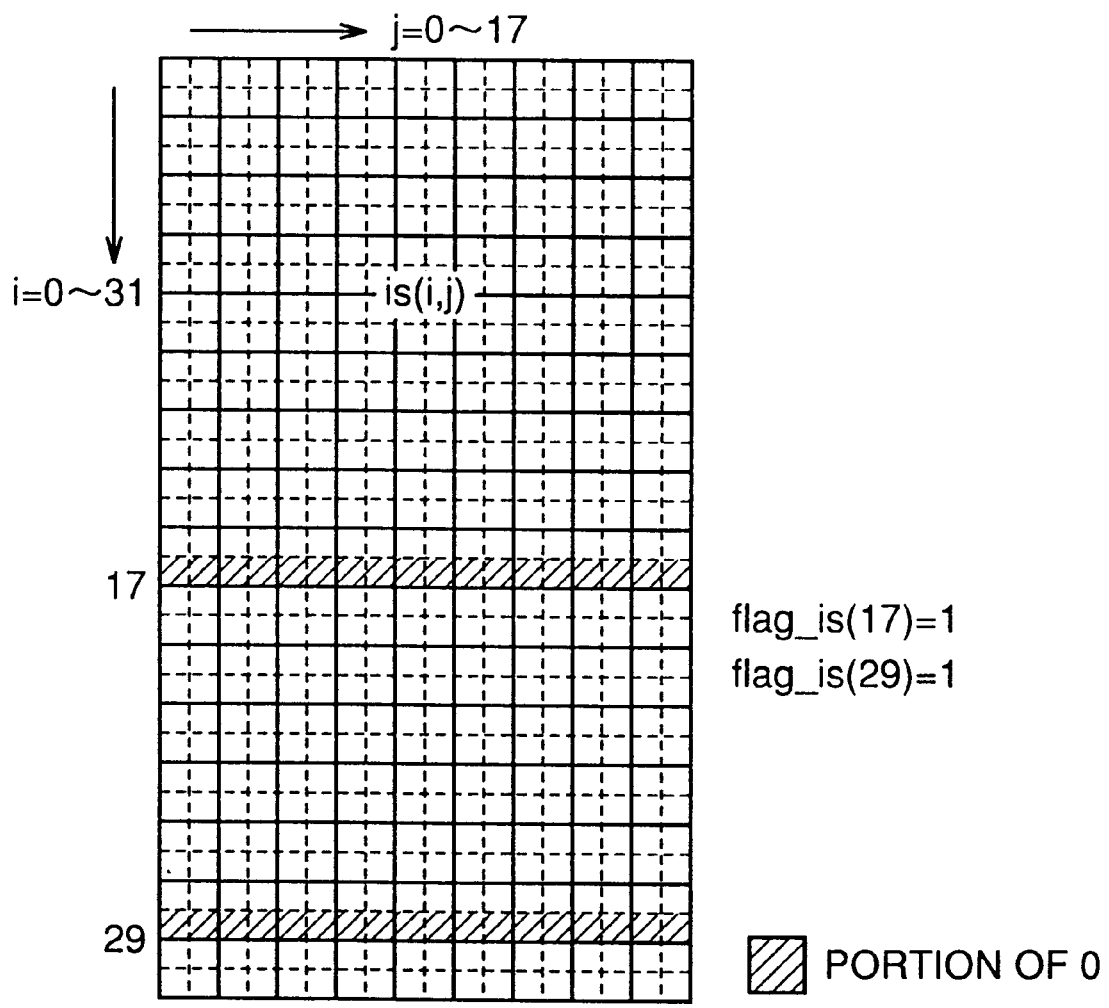
FIG. 8 is a view showing the zero detecting processing by the zero detector 21.

Referring to FIGS. 7 and 8, description will now be given on the processing in step S32 shown in FIG. 6. The processing in step S32 is performed on Huffman code data is(i, j) ($0 \leq i \leq 31$, $0 \leq j \leq 17$) already obtained before step S18 for determining whether all the values is(i, 0)–is(i, 17) in i-th row (i.e., band in the i-th position) are equal to zero or not. Zero detector 21 receives Huffman code data is(i, j) ($0 \leq i \leq 31$, $0 \leq j \leq 17$) from Huffman decoder 8 (S41). A counter i is set to zero (S42). Calculation is performed to obtain a logical sum a of all Huffman code data is(i, 0)–is(i, 17) included in the i-th band (S43). If all the values of is(i, 0)–is(i, 17) are zero, the logical sum a is equal to zero. If the logical sum a is equal to zero (a=0 in S44), flag flag__is(i) (S46) is set to one. If the logical sum a is not zero (a≠0 in S44), flag flag__is(i) is set to zero (S45). After the processing in step S45 or S46, counter i is incremented by one (S47). It is determined whether the value of counter i is smaller than 32 or not (S48). If the value of counter i is smaller than 32 (YES in step S48), processing in and after step S43 is repeated. If the value of counter i is equal to or larger than 32 (NO in step S48), processing in step S32 is ended.

Referring to FIG. 8, it is assumed that all the values of in(i, j) ($0 \leq j < 18$) are equal to zero when i is equal to 17 or 29. In this case, the values of flag__is(17) and flag__is(29) are set to one.

Figure 9:
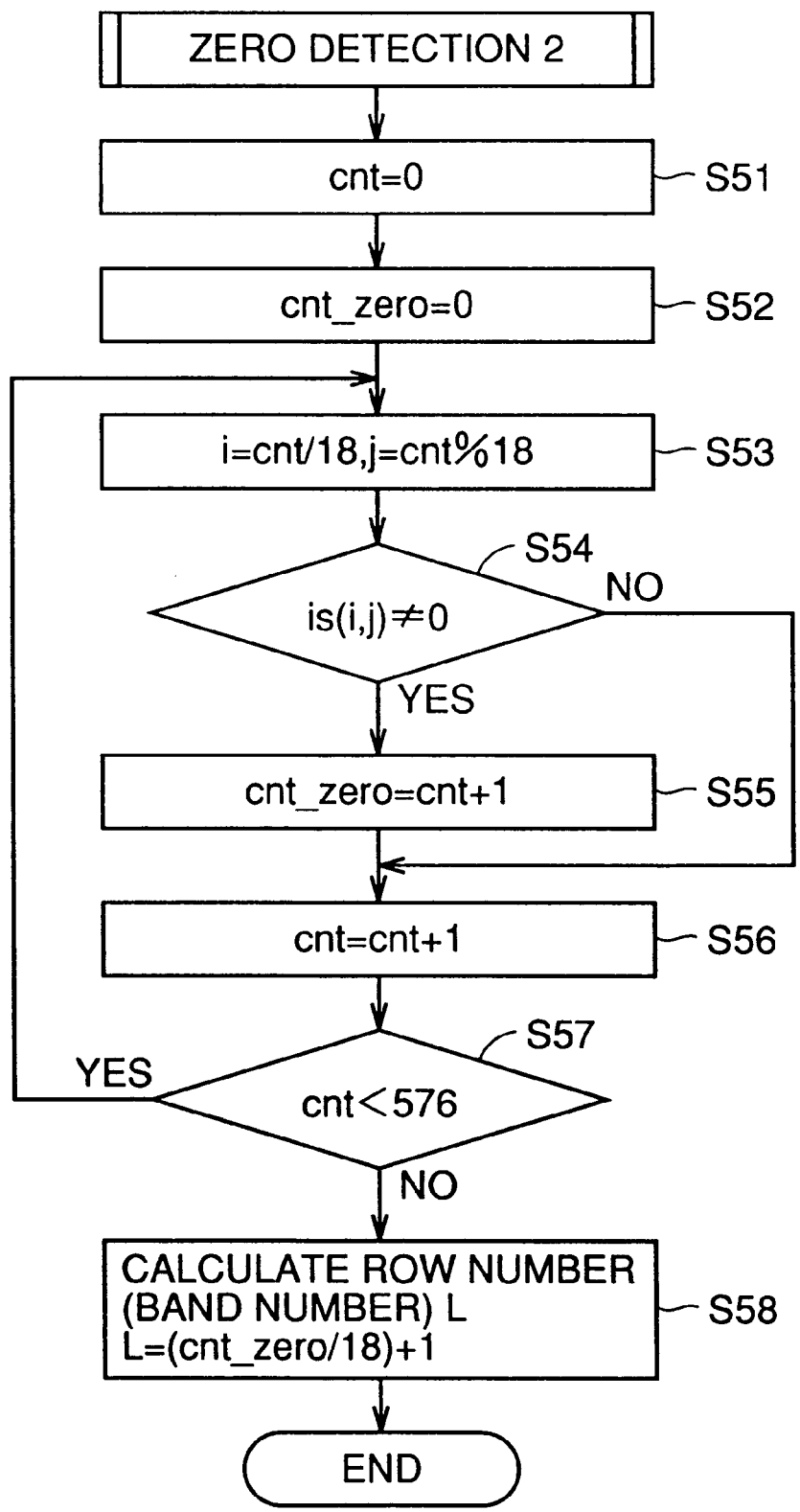
FIG. 9 is a flowchart showing zero detecting processing by a zero detector 22.

Referring to FIG. 9, description will now be given on the processing in step S33 shown in FIG. 6. For coding of MP3, such an algorithm is employed that minimizes degradation of signals in a band of human hearing. In other words, only the sounds which humans can hear are coded, and data of sound components beyond the range of human hearing (particularly, high-frequency components) is deleted. In the Huffman decoding processing, only the coded portion is decoded with a Huffman table, and the result of decoding of the uncoded portion is set to zero. Zero detector 22 utilizes the above features, and performs processing which allows fast execution of inverse quantization and subsequent processing (i.e., processing in and after step S34 in FIG. 6).

Zero detector 22 sets a counter cnt to zero (S51), and sets a counter cnt__zero to zero (S52). Counter cnt counts up every time the raster scanning is successively effected on Huffman code data is(i, j) shown in FIG. 8 from its upper left to lower right. In scanning operations after counter cnt__zero performs the raster scanning on the same Huffman code data is(i, j), it holds the value of counter cnt at the time when all Huffman code data is(i, j) are equal to zero.

From the value of counter cnt, band number i and sample number j are obtained in accordance with the following formulas (8) and (9), respectively.

$$i = cnt/18 \text{(integer portion obtained by dividing counter cnt by 18)} \quad (8)$$

$$j = cnt \% 18 \text{(reminder obtained by dividing counter cnt by 18)} \quad (9)$$

It is determined whether the Huffman code data is(i, j) is 0 or not (S54). If Huffman code data is(i, j) is not 0 (YES in 54), a value obtained by adding one to the current counter cnt is written into counter cnt__zero (S55). When Huffman code data is(i, j) is zero (NO in S54) or after the processing in step S55, counter cnt is incremented by one (S56). It is determined whether counter cnt is smaller than 576 or not (S57). If counter cnt is smaller than 576 (YES in S57), processing in and after step S53 is repeated. If counter cnt is equal to or larger than 576 (NO in S57), the row number (band number) L is calculated in accordance with the following formula (10) (S58).

$$L = (cnt\_zero/18) + 1 \quad (10)$$

Owing to the above processing, it is ensured in the Lth and succeeding bands that all Huffman code data is(i, j) are equal to zero. For example, in the case of cnt__zero=424((i, j)=(23, 10)), all Huffman code data is(i, j) are all zero in the bands of the row number L of 24 or more. This row number L is obtained by the processing in and after step S34 in FIG. 6.

Figure 10:
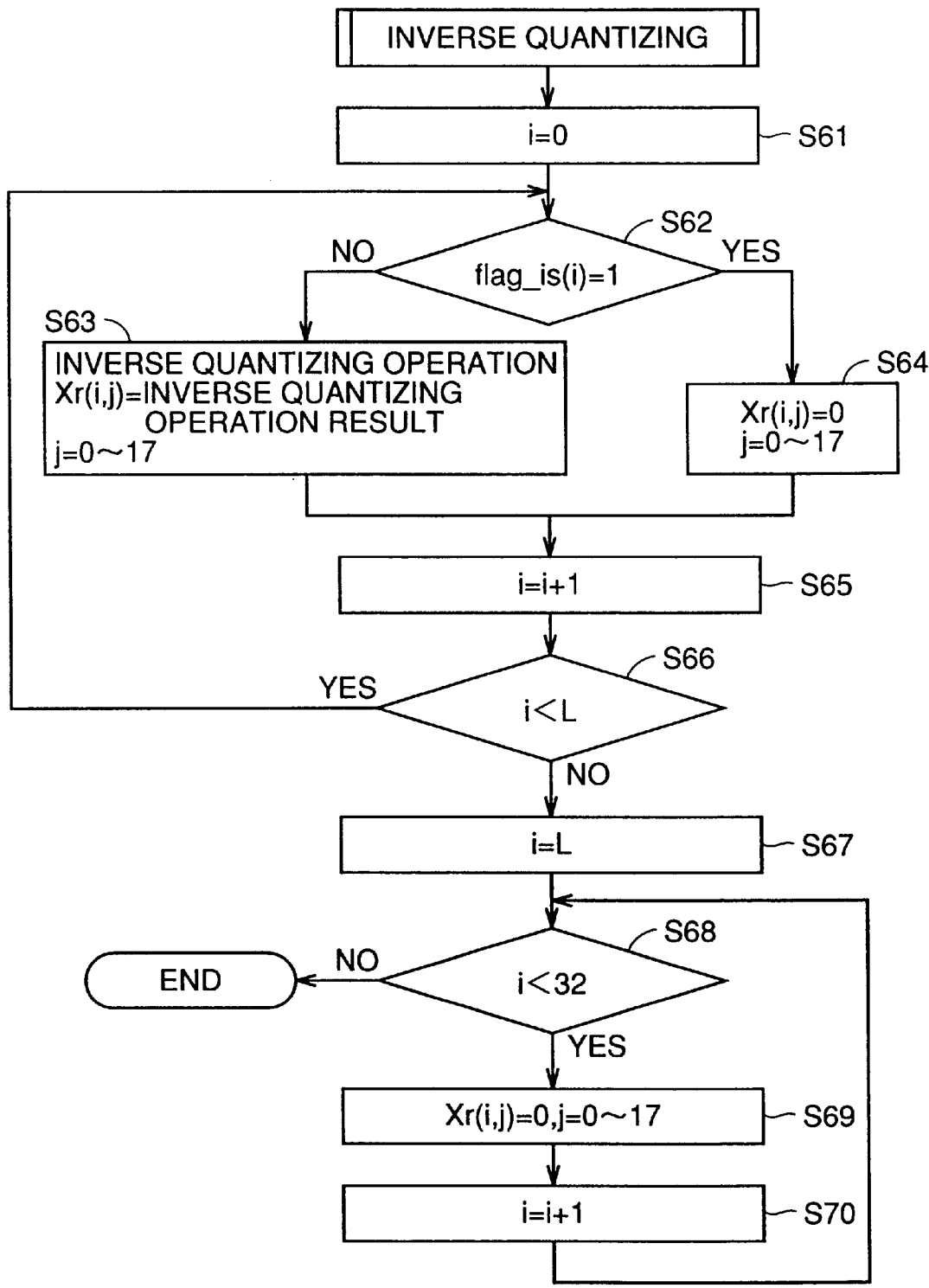
FIG. 10 is a flowchart showing inverse quantizing processing by an inverse quantizer 23.

Referring to FIG. 10, description will now be given on the processing in step S34 shown in FIG. 6. Inverse quantizer 23 sets counter i to zero (S61). Flag flag__is(i) issued from zero detector 21 is checked (S62). In the case of flag__is(i)=0 (NO in S62), inverse quantizing operation is executed, and the result is stored in Xr(i, j) ($0 \leq j < 18$) (S63). The result XL(i, j) of inverse quantizing operation is obtained according to formula (1), as is done in the prior art. In the case of flag__is(i)=1 (YES in S62), Huffman code data is(i, j) in i-th row is zero so that the operation result Xr(i, j) of formula (1) goes to zero. Therefore, the operation of the formula (1) is eliminated, and 0 is substituted into Xr(i, j) ($0 \leq j < 18$) (S64).

By arranging zero detector 21 described above in a position before inverse quantizer 23, the inverse quantizing operation (i.e., the operation according to formula (1)) can be eliminated 18 times per row (per band) so that the inverse quantization can be executed fast.

Inverse quantizer 23 increments counter i by one (S65), and determines whether counter i is smaller than row number L obtained by zero detector 22 or not (S66). If counter i is smaller than row number L (YES in S66), the processing in and after step S62 is repeated. It is already known that all Huffman code data is(i, j) ($L \leq i \leq 32$, $0 \leq j < 18$) in and after Lth row are equal to zero if counter i is equal to or larger than row number L (NO in S66). Accordingly, zero is substituted into all the subsequent inverse quantizing operation results Xr(i, j). More specifically, counter i is set to L (S67). It is determined whether counter i is smaller than 32 or not (S68). If counter i is smaller than 32 (YES in S68), zero is substituted into inverse quantizing operation result Xr(i, j) ($0 \leq j < 18$) (S69). Counter i is incremented by one (S70), and processing in and after step S68 is repeated. When counter i reaches 32 or more SO in S68), inverse quantizing processing (S34 in FIG. 6) by inverse quantizer 23 is ended.

As described above, it is merely required that the calculation according to formula (1) is performed only within a range of $0 \leq i < L$, and the results are stored in Xr(i, j) ($0 \leq j < 18$). In a range of $L \leq i < 32$, it is not necessary to perform the calculation according to formula (1). Accordingly, the operation according to formula (1) can be eliminated {(32−L)×18} times.

Figure 11:
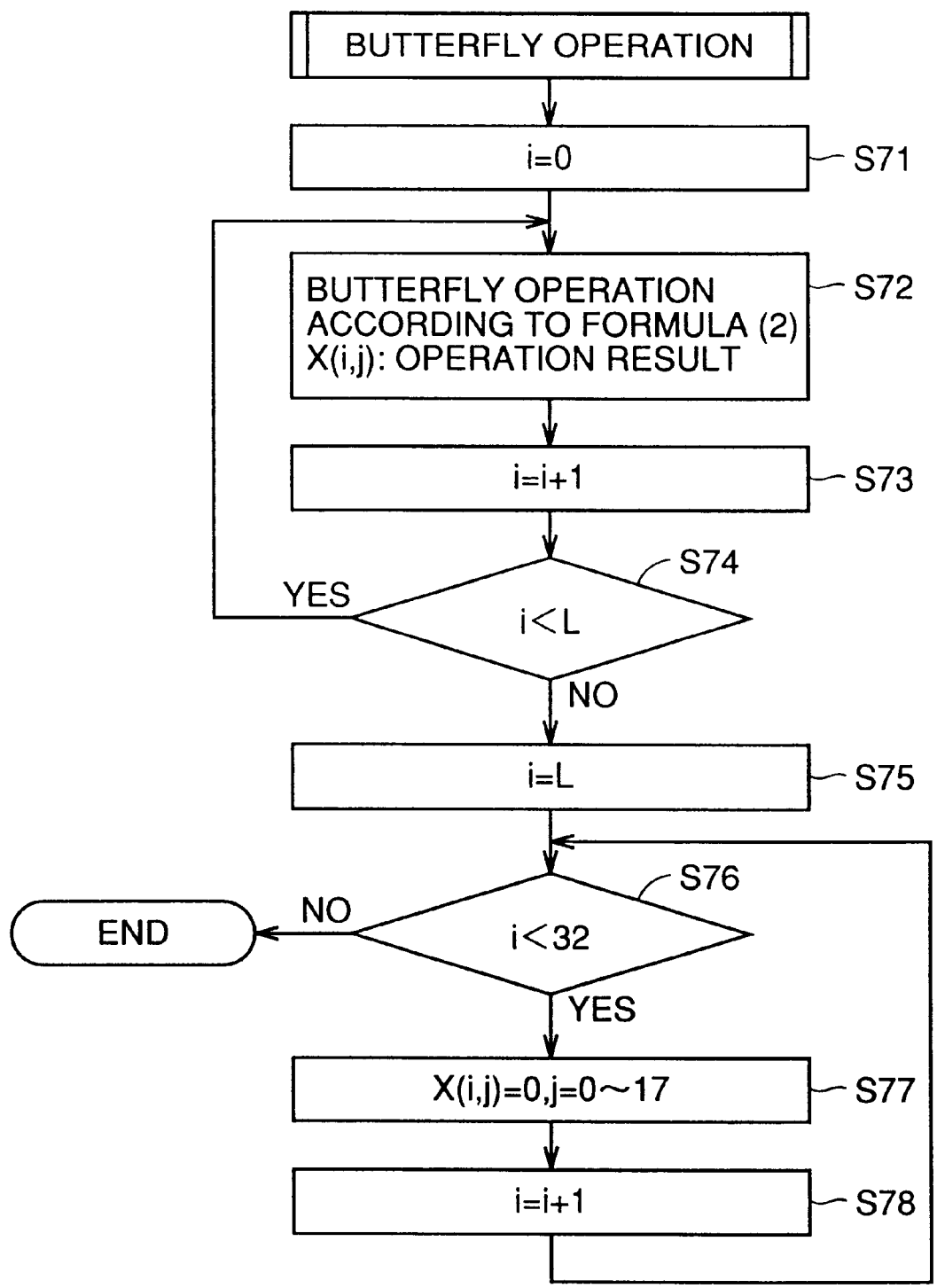
FIG. 11 is a flowchart showing a butterfly operation processing by a butterfly operating portion 25.

Referring to FIG. 11, the processing in step S35 shown in FIG. 6 will now be described.

Butterfly operating portion 25 sets zero in counter i (S71) to zero. Similarly to the prior art, butterfly operating portion 25 performs the butterfly operation according to formula (2) (S72). Counter i is incremented by one (S73). It is determined whether counter i is smaller than row number L obtained by zero detector 22 (S74). If counter i is smaller than L (YES in S74), processing in and after step S72 is repeated.

It is known in advance that inverse quantizing operation results Xr(i, j) in and after Lth row are all zero. Accordingly, all operation results X(i, j) of the butterfly operation in and after Lth row are equal to zero. Accordingly, when counter i reaches L or more (NO in S74), L is reset in counter i (S75), and it is determined whether counter i is smaller than 32 or not (S76). If counter i is smaller than 32 (YES in S76), zero is substituted into butterfly operation result X(i, j) ($0 \leq j < 18$) (S77). Counter i is incremented by one (S78), and the process returns to step S76. If counter i is 32 or more (NO in S76), the process is ended.

For the butterfly operation, calculation is performed according to formula (2) only in a range of $0 \leq i < L$ similarly to the inverse quantizing operation based on the result of zero detector 22, and the results are stored in X(i, j) ($0 \leq j < 18$). It is already known that all the values of Xr(i, j) ($L \leq i \leq 31$, $0 \leq j < 18$) in and after Lth row are equal to zero. Therefore, calculation according to formula (2) is not required, and the operation to be performed for i according to formula (2) can be eliminated (31−L) times.

Description will now be given on the processing in step S36 shown in FIG. 6. Zero detector 26 has a structure similar to that of zero detector 21. Therefore, the processing in step S36 is similar to that in step S32 (FIG. 6) except for the inputs. Zero detector 26 acts on butterfly operation results X(i, j) ($0 \leq i < 32$, $0 \leq j < 18$). More specifically, zero detector 26 determines whether all the butterfly operation results X(i, 0)−X(i, 17) in row i (band in the i-th position) are equal to zero or not, and sets the results of determination in flag__X(i) ($0 \leq i < 32$). The manner of this determination is the same as that in the processing in step S32 already described with reference to FIGS. 7 and 8, and therefore descriptions thereof will not be repeated here.

Figure 12:
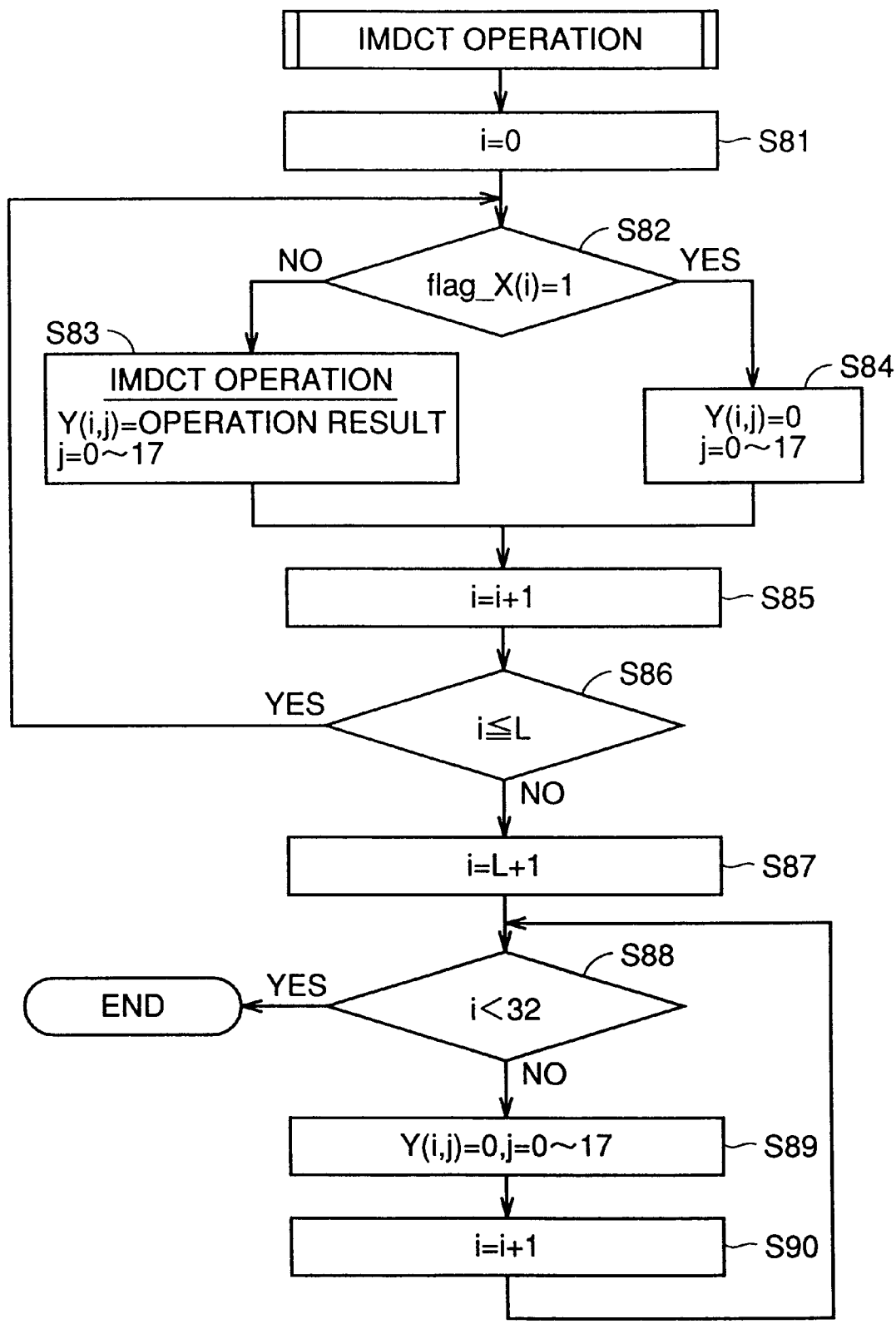
FIG. 12 is a flowchart showing IMDCT processing by an IMDCT operating portion 27.

Referring to FIG. 12, description will now be given on the processing in step S37 shown in FIG. 6.

IMDCT operating portion 27 sets counter i to zero (S81). Output flag__X(i) of zero detector 26 is checked (S82). In the case of flag__X(i)=0 (NO in S82), a series of IMDCT processing is performed such that a result $H_i(n)$ of window operation is obtained according to formulas (3)–(5), and then processing relating to overlapping is effected on the window operation result $H_i(n)$ to obtain a processing result Y(i, j) ($0 \leq j < 18$) (S83), similarly to the prior art. In the case of flag__X(i)=1 (YES in S82), all the butterfly operation results X(i, j) ($0 \leq j < 18$) in the i-th row are equal to zero. Therefore, it is known in advance that the processing results Y(i, j) ($0 \leq j < 18$) are equal to zero so that IMDCT operating portion 27 does not perform the IMDCT processing, and substitutes zero into the processing results Y(i, j) ($0 \leq j < 18$) (S84).

In the IMDCT processing, the operations according to formulas (3) and (5) are executed so that the amount of operations per processing has been large. By adding zero detector 26 described above, the IMDCT processing can be eliminated, and the amount of operations is reduced. This results in increase in speed of the decoding processing.

After the processing in step S83 or S84, IMDCT operating portion 27 increments counter i by one (S85), and determines whether counter i is larger than the row number L obtained in zero detector 22 or not (S86). If the counter i is equal to or smaller than row number L obtained in zero detector 22 (YES in S86), processing in and after step S82 is repeated.

When counter i exceeds row number L (NO in S86), IMDCT operating portion 27 sets (L+1) in counter i (S87), and determines whether counter i is smaller than 32 or not (S88). If counter i is smaller than 32 (NO in S88), it is already known that processing results Y(i, j) ($0 \leq j < 18$) are equal to zero for the reason similar to that in the case of $flag_{13}$ X(i)=1 already described. Therefore, IMDCT operating portion 27 does not perform the IMDCT processing, and substitutes zero into processing results Y(i, j) ($0 \leq j < 18$) (S89). Counter i is incremented by one (S90), and the process returns to step S88. When counter i is equal to 32 or more (YES in S88), the process is ended.

IMDCT operating portion 27 performs the IMDCT processing even when counter i is equal to L. This is because there is no positive proof that butterfly operation results X(L, 0)–X(L, 7) according to butterfly operation formula (2) are equal to zero.

With respect to $(L+1) \leq i < 32$, the butterfly operation results X(i, j) ($0 \leq j < 18$) are equal to zero so that the IMDCT processing is not required. Accordingly, the IMDCT processing can be eliminated $\{32-(L+1)\}$ times.

Figure 13:
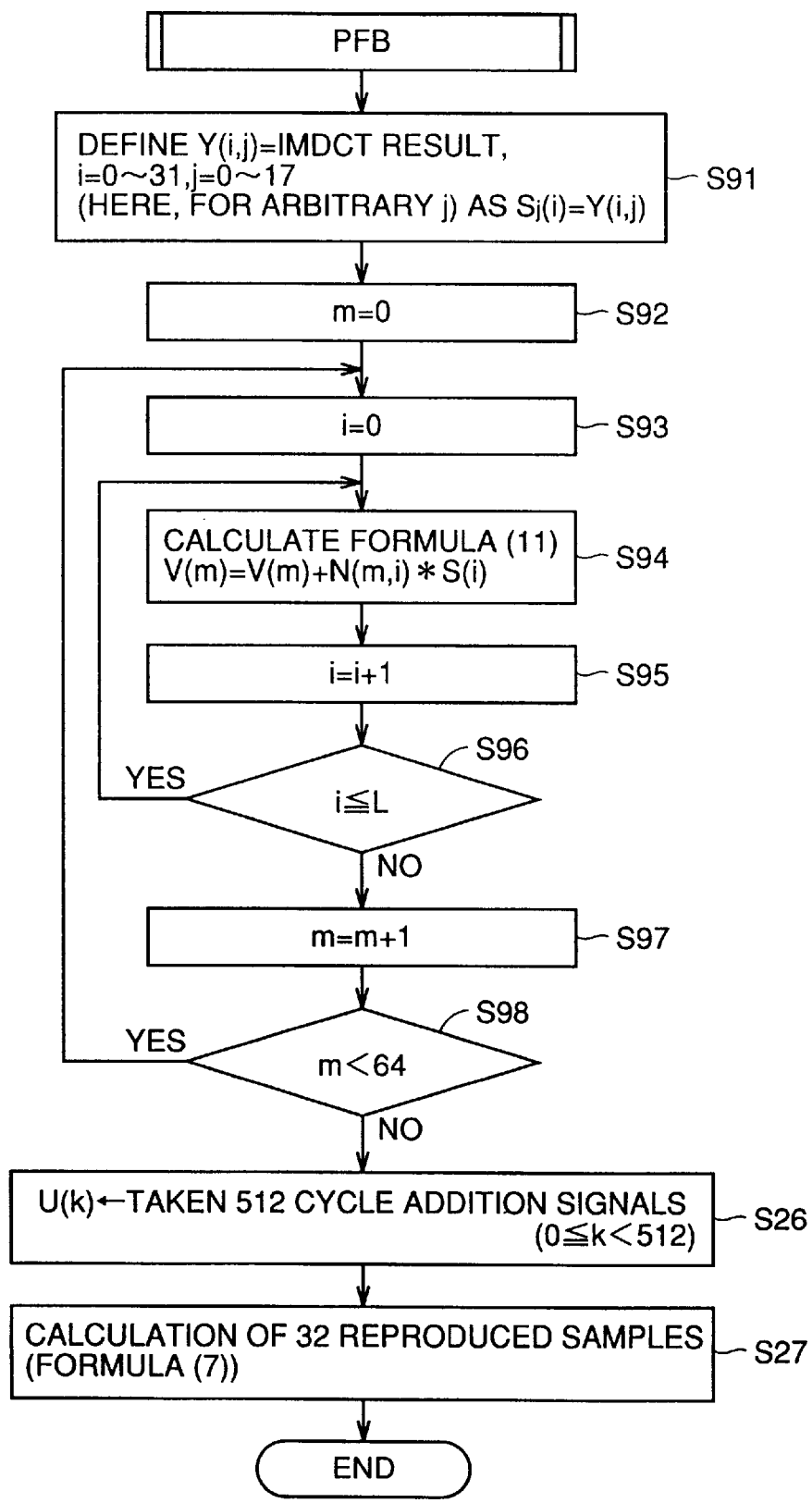
FIG. 13 is a flowchart showing subband composing processing by subband composing processing portion 28.

Referring to FIG. 13, description will now be given on the processing in step S38 shown in FIG. 6. The subband composition is achieved by 512-tap PFB. Subband composing portion 28 defines the subband inputs of 32 samples as $S_j(i)$=Y(i, j) ($0 \leq i < 32$, j: arbitrary sample number) (S91).

Formula (6) for obtaining a vector V(m) is originally calculated to obtain the product-sums in a range of $0 \leq i < 32$. However, from the result of zero detector 22, it is known in advance that $S_j(i)$ is equal to zero in a range of $L < i < 32$. Therefore, $S_j(i)$ in the range of $L < i < 32$ is not required when obtaining vector V(m). Accordingly, the formula (6) can be rewritten into the following formula (11).

$$V(m) = \sum_{i=0}^{L} N(m, i) S_j(i), 0 \leq m < 64 \qquad (11)$$

The subband composing portion 28 sets a counter m to zero (S92), and sets counter i to zero (S93). Subband composing portion 28 performs the calculation according to formula (11) for obtaining vector V(m) (S94–S96). When vector V(m) for counter m which is currently set is obtained (NO in S96), counter m is incremented by one (S97), and it is determined whether counter m is smaller than 64 or not (S98). If counter m is smaller than 64 (YES in S98), the process returns to step S93, and vector V(m) for counter m which is set is obtained according to formula (11). When counter m is equal to 64 or more (NO in S98), 512 data are taken out from V(m) ($0 \leq m < 1024$), and are stored in variables U(k) (k=0–511) (S26). Subband composing portion 28 performs the calculation using U(k) according to formula (7) similar to the conventional formula, whereby 32 reproduced sample data (time region signals) are obtained.

By applying formula (11), it is possible to eliminate the product-sum operation $\{64 \times (31-L)\}$ times per flow shown in FIG. 13, and therefore to eliminate the product-sum operation $\{18 \times 64 \times (31-L) = 1152 \times (31-L)\}$ times per granule. Therefore, the subband composing processing is executed fast.

Figure 14:
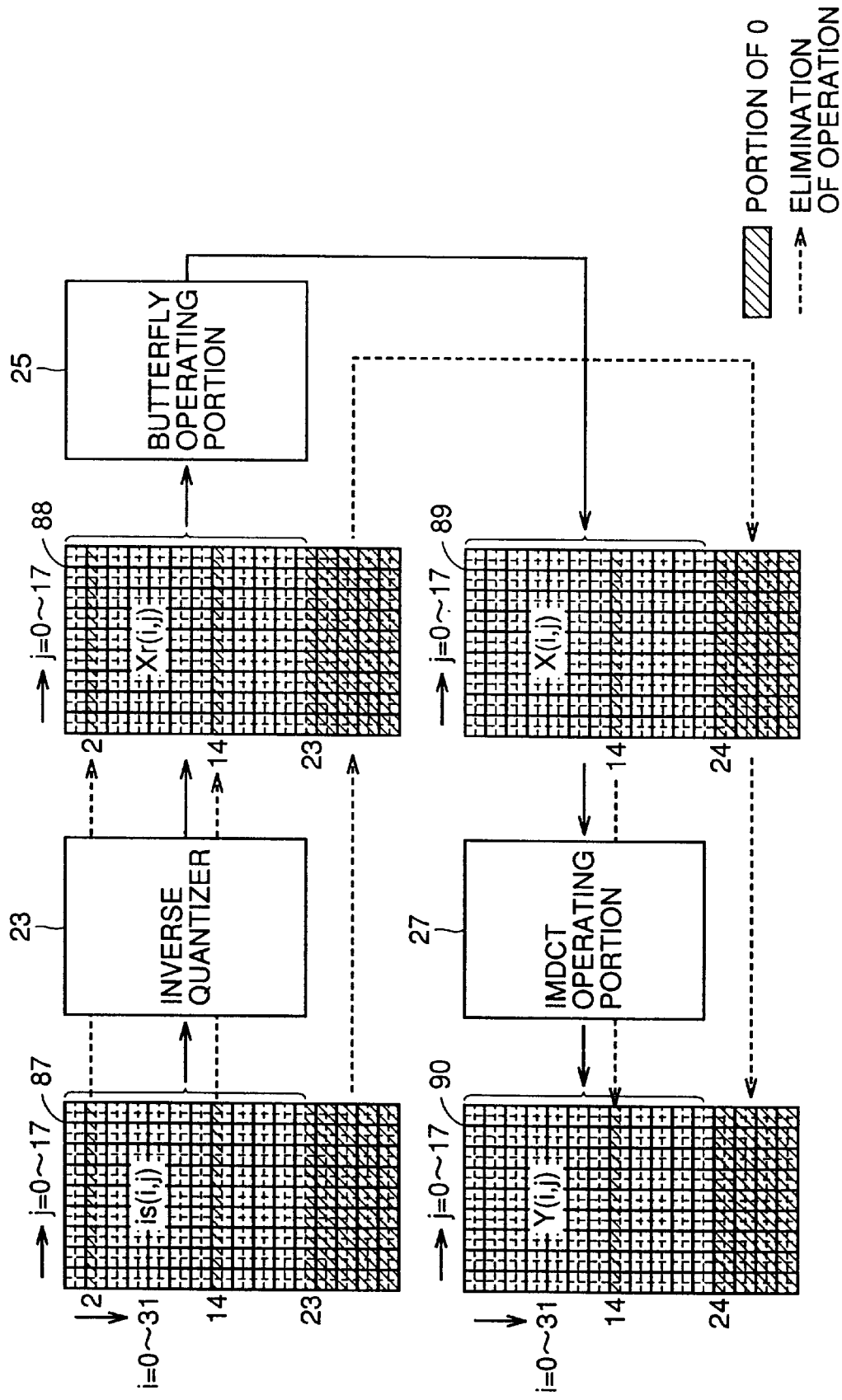
FIG. 14 is a view for showing a number of times of operations which are eliminated by the decoder for the audio data portion of MP3 according to the first embodiment.

Referring to FIG. 14, description will now be given on an example of the number of times of the operation which can be eliminated owing to employment of zero detectors 21, 22 and 26. Huffman code data 87 obtained by Huffman decoder 8 is received, and zero detectors 21 and 22 perform the operation. It is now assumed that, as a result of this operation, it is detected that Huffman code data is(i, j) ($0 \leq j < 18$) in rows of the row numbers i of 2 and 14 (i=2, 14) are all zero, and Huffman code data is(i, j) ($L \leq i < 32$, $0 \leq j < 18$) in and after the row of row number L of 23 are all zero. In inverse quantizer 23, therefore, it is possible to eliminate the operation according to formula (1) by 1+1+ (32−23)×18=198 times. Further, butterfly operating portion 25 which performs the butterfly operation on inverse quantizing operation result 88 is allowed to eliminate the butterfly operation from 23rd rows to 31st rows. According to the butterfly operation expressed in formula (2), the processing is performed for every two rows. In butterfly operating portion 25, therefore, the operations can be eliminated (32−23−1)=8 times. In butterfly operation results 89, it is assumed that operation results X(i, j) (i=14, 24–31, $0 \leq j < 18$) in 14th row and 24th through 31st rows are equal to zero. Zero detector 26 detects row number i=14. Therefore, IMDCT 27 can eliminate the IMDCT processing for 14th row and 24th through 31st rows, and thus can eliminate the IMDCT processing nine times in total.

By adding zero detector 22 described above, operations per granule can be eliminated as follows. The inverse quantizing operation (formula (1)) can be eliminated {(32−L)×18} times, the butterfly operation (formula (2)) can be eliminated (31−L) times in connection with counter i, the IMDCT operation can be eliminated (31−L) times, and the product-sum operation (formula (6) in subband composing portion 28 can be eliminated by 18×64×(31−L)=1152×(31−L) times. Accordingly, the data of MP3 can be decoded fast.

Further, employment of zero detector 21 can further reduce the required times of inverse quantizing operation, and employment of zero detector 26 can further reduce the required times of the IMDCT processing.

The decoder according to the embodiment may be achieved by a computer. For this, the processing to be performed by the decoder is program-executed by a CPU (Central Processing Unit), and the results of operations by respective processing portions are stored in a memory.

Second Embodiment

Figure 2:
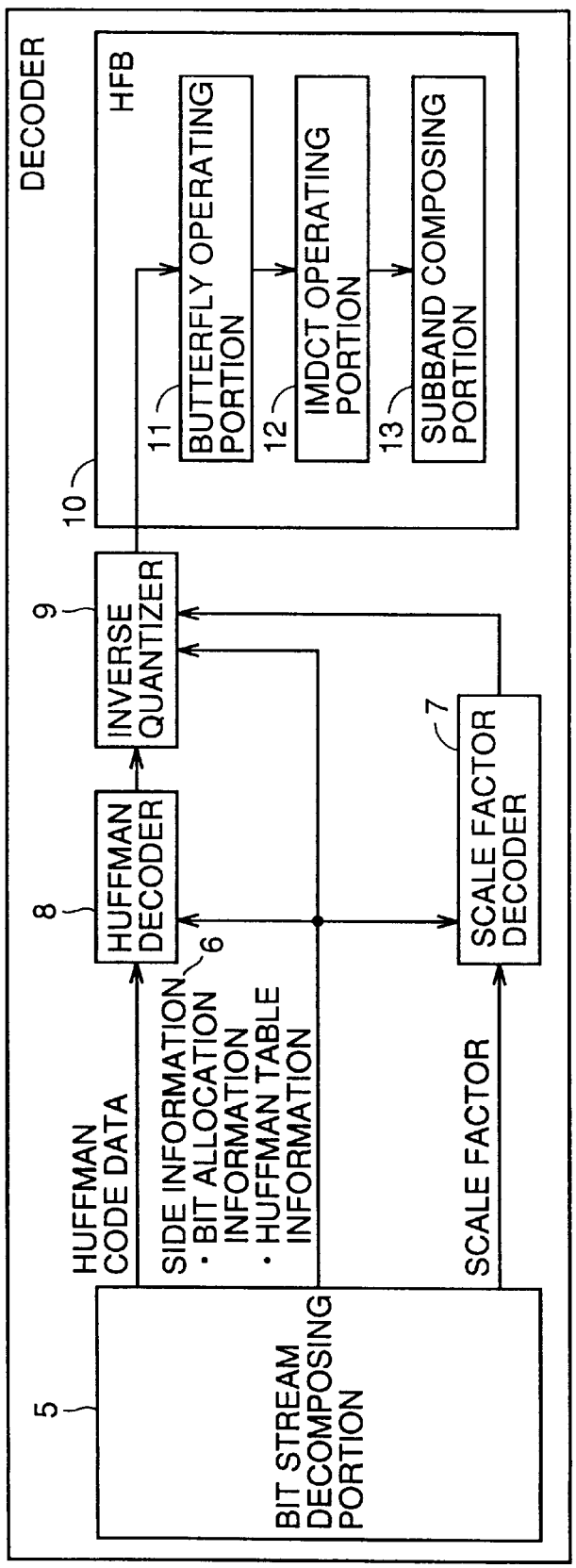
FIG. 2 is a block diagram showing a structure of a decoder for an audio data portion of MP3 in the prior art.

Description will now be given on a decoder shown in FIG. 2, which is completed by using an MPU (Micro Processing Unit, i.e., a RISC (Reduced Instruction Set Computer) processor not having a specific addressing mode) and a memory (Dynamic Random Access Memory) connected to the MPU.

Figure 15:
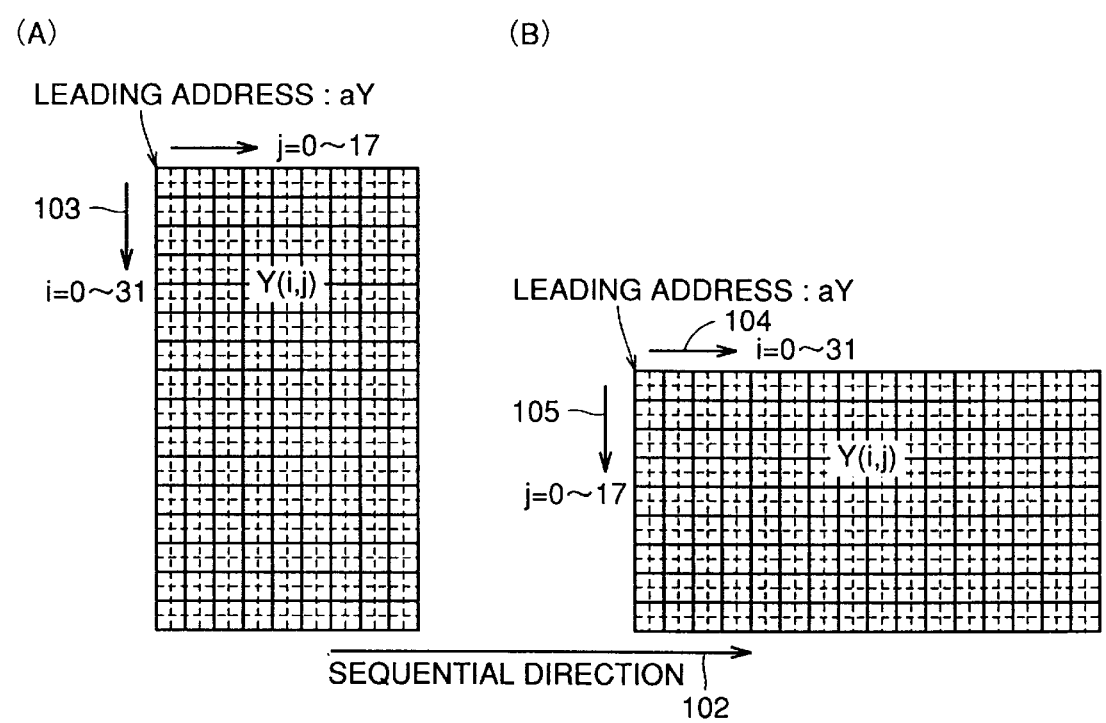
FIG. 15 shows a manner of storing results of IMDCT processing by a decoder for an audio data portion of MP3 according to a second embodiment of the invention.

In FIG. 15, (A) shows a state where results Y(i, j) of the IMDCT processing are stored in a memory (RAM connected to an MPU). In FIG. 15, (B) shows a state where the results of the IMDCT processing are stored at rows and columns in the memory which correspond to the columns and rows at (A) in FIG. 15, respectively. A sequential direction of the memory is indicated by a lateral arrow 102. The input data for PFB is successively read in the direction of i indicated by an arrow 103 or 104. At (A) in FIG. 15, therefore, the data required for the operation according to formula (6) is read in the longitudinal direction indicated by arrow 103. In this case, the address calculation is required every time one data is read, and a plurality of data cannot be continuously read. Further, the memory is referred to on a random basis. Therefore, a cache hit rate is low, and the operation is more likely to enter the wait state every time the memory is accessed.

Accordingly, the results of IMDCT processing is stored as shown at (B) in FIG. 15, whereby the data required for the operation according to formula (6) can be sequentially read in the direction of arrow 104, and the foregoing problem can be overcome. In particular, if the MPU supports a load instruction with an automatic increment function, the address calculation is not required.

Figure 16:
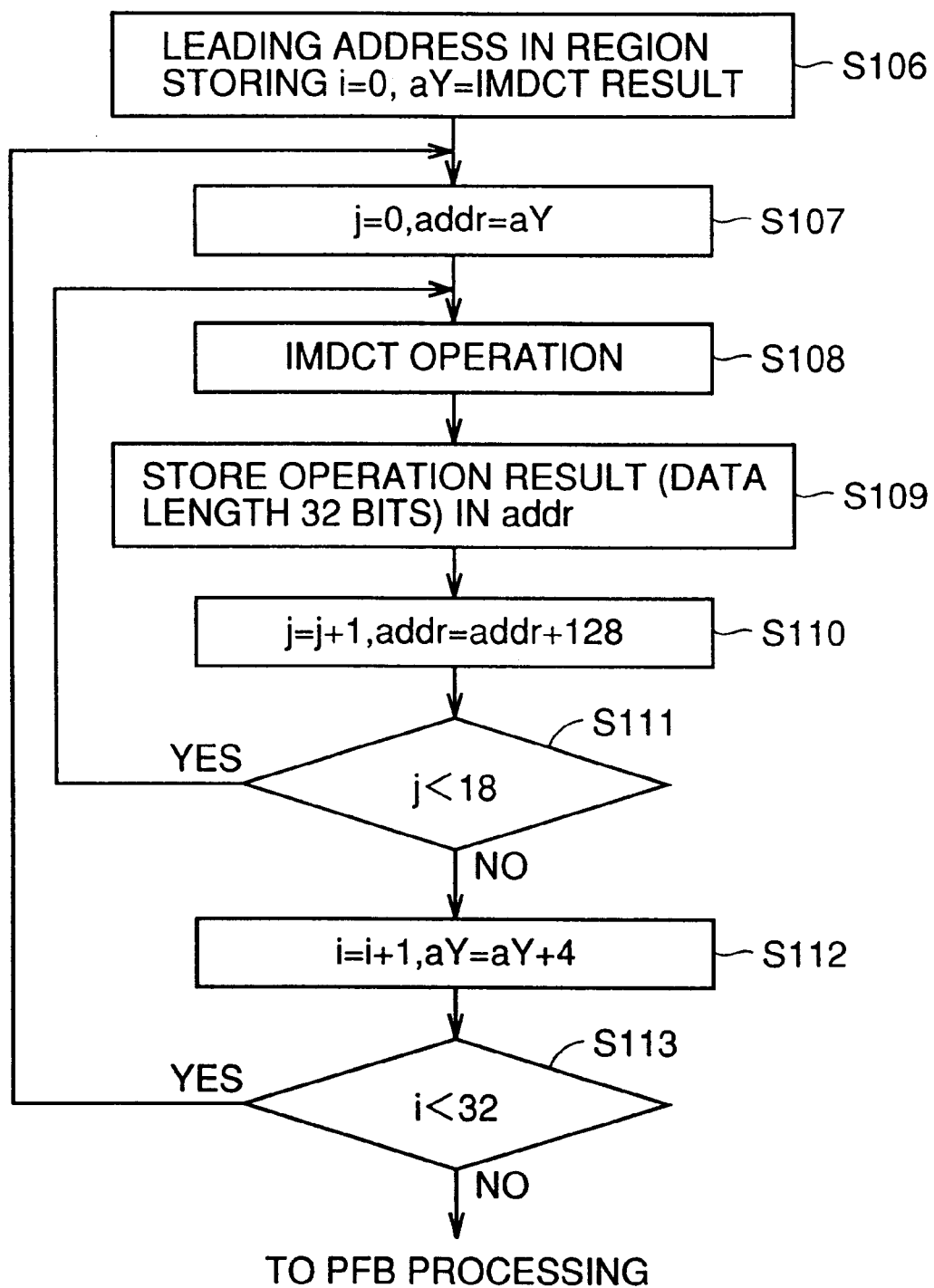
FIG. 16 shows IMDCT processing by the decoder for the audio data portion of MP3 according to the second embodiment of the invention.

Referring to FIG. 16, description will now be given on the processing in IMDCT operating portion shown in FIG. 2. An address aY is determined as the leading address in the region of the memory for storing result Y(i, j) of the IMDCT processing, and counter i is set to zero (S106). It is assumed that the IMDCT operation result has a data length of 4 bytes (32 bits). Leading address aY is substituted into variable addr, and counter j is set to zero (S107). The IMDCT operation is performed in a conventional manner (S108), and the processing result is stored in the region of addr address (S109). The results of the IMDCT operation are successively obtained in the direction of an arrow 105. Therefore, the region storing the next result is in the position preceding by 32×4 bytes=128 bytes. Accordingly, 128 is added to variable addr, and counter j is incremented by one (S110). Processing from step S108 to step S110 is repeated 18 times (S111). Then, leading address aY is shifted by 4 bytes (1 data) in the sequential direction, and counter i is incremented by one (S112). The processing from step S107 to step 112 is repeated 32 times (S113) so that the result of IMDCT processing is stored in the memory as shown at (B) in FIG. 15.

Thereby, in the subsequent subband composing processing in subband composing portion 13, the calculation according to formula (6) can be performed by reading the data fast, and the data of MP3 can be decoded fast.

Third Embodiment

Figure 17:
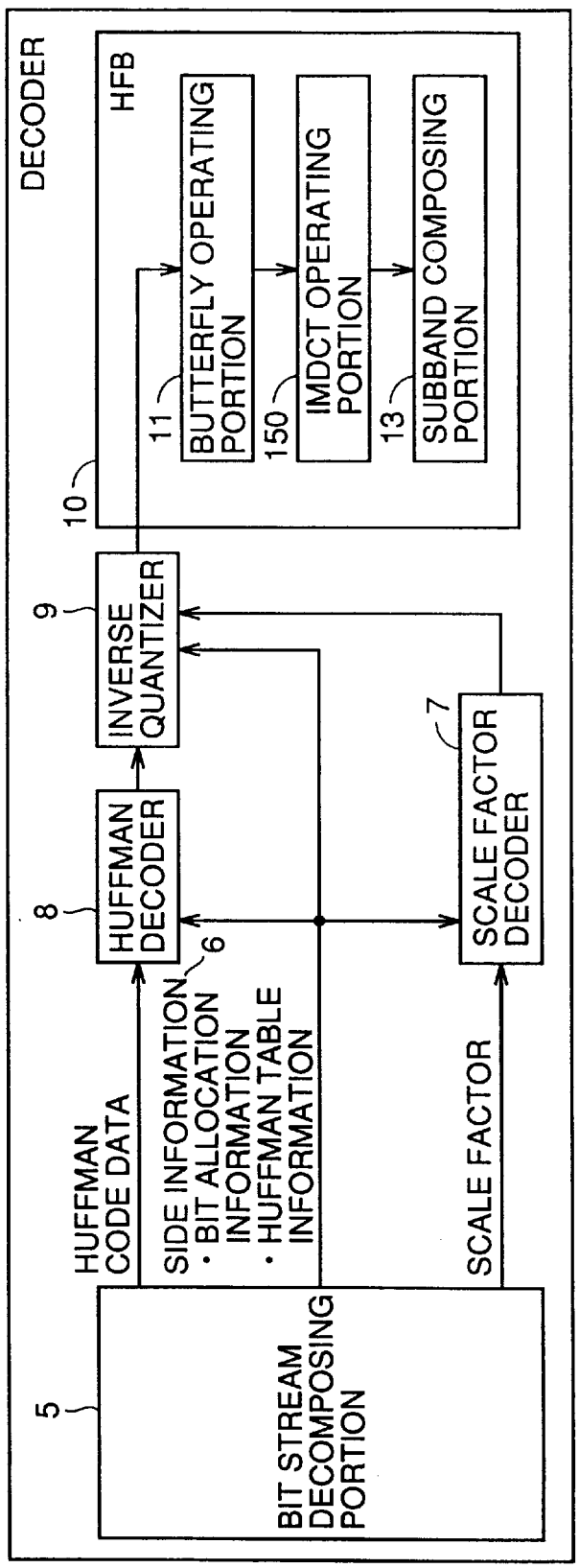
FIG. 17 is a block diagram showing a structure of a decoder for an audio data portion of MP3 according to a third embodiment of the invention.

Referring to FIG. 17, a decoder of an audio data portion of MP3 according to this embodiment employs an IMDCT operating portion 150 instead of a conventional IMDCT operating portion 12 already described with reference to FIG. 2. Accordingly, description of structure portions other than the above will not be repeated here.

Coefficients of IMDUCT processing formula (4) have symmetry, as can be understood from formula (12) obtained by changing formula (4). In connection with $Z_i(n)$ of formula (3), therefore, a relationship of a formula (13) is established, and calculation of $Z_i(n)$ is required only for ranges of $0 \leq n \leq (N/4)$ and $(N/2) \leq n \leq (3N/4)$. Accordingly, the number of required times of calculation according to formula (3) can be half the number in the prior art.

In the case of, e.g., N=12 and k=0, a relationship of formula (14) is established. Therefore, a formula (15) is obtained from formula (13).

$$\left. \begin{array}{l} C\left(\dfrac{N}{2} - n - 1, k\right) = -C(n, k) \\ C(N - n - 1, k) = C\left(\dfrac{N}{2} + n, k\right) \quad 0 \leq n < \dfrac{N}{4} \end{array} \right\} \quad (12)$$

$$\left. \begin{array}{l} Z_i\left(\dfrac{N}{2} - n - 1\right) = -Z_i(n) \\ Z_i(N - n - 1) = Z_i\left(\dfrac{N}{2} + n\right) \quad 0 \leq n < \dfrac{N}{4} \end{array} \right\} \quad (13)$$

$$\left. \begin{array}{l} C(5 - n, 0) = -C(n, 0) \\ C(11 - n, 0) = C(6 + n, 0) \quad 0 \leq n \leq 2 \end{array} \right\} \quad (14)$$

-continued $$Z_i(3) = -Z_i(2), \quad Z_i(9) = Z_i(8)$$
$$Z_i(4) = -Z_i(1), \quad Z_i(10) = Z_i(7)$$
$$Z_i(5) = -Z_i(0), \quad Z_i(11) = Z_i(6)$$
(15)

Accordingly, it can be understood that calculation of only six values of $Z_i(0)$, $Z_i(1)$, $Z_i(2)$, $Z_i(6)$, $Z_i(7)$ and $Z_i(8)$ is required, and the number of times of calculation is reduced to a half.

By utilizing the above symmetry, the required number of times of calculation according to formula (3) is reduced to a half, and the decoding processing can be performed fast.

Figure 18:
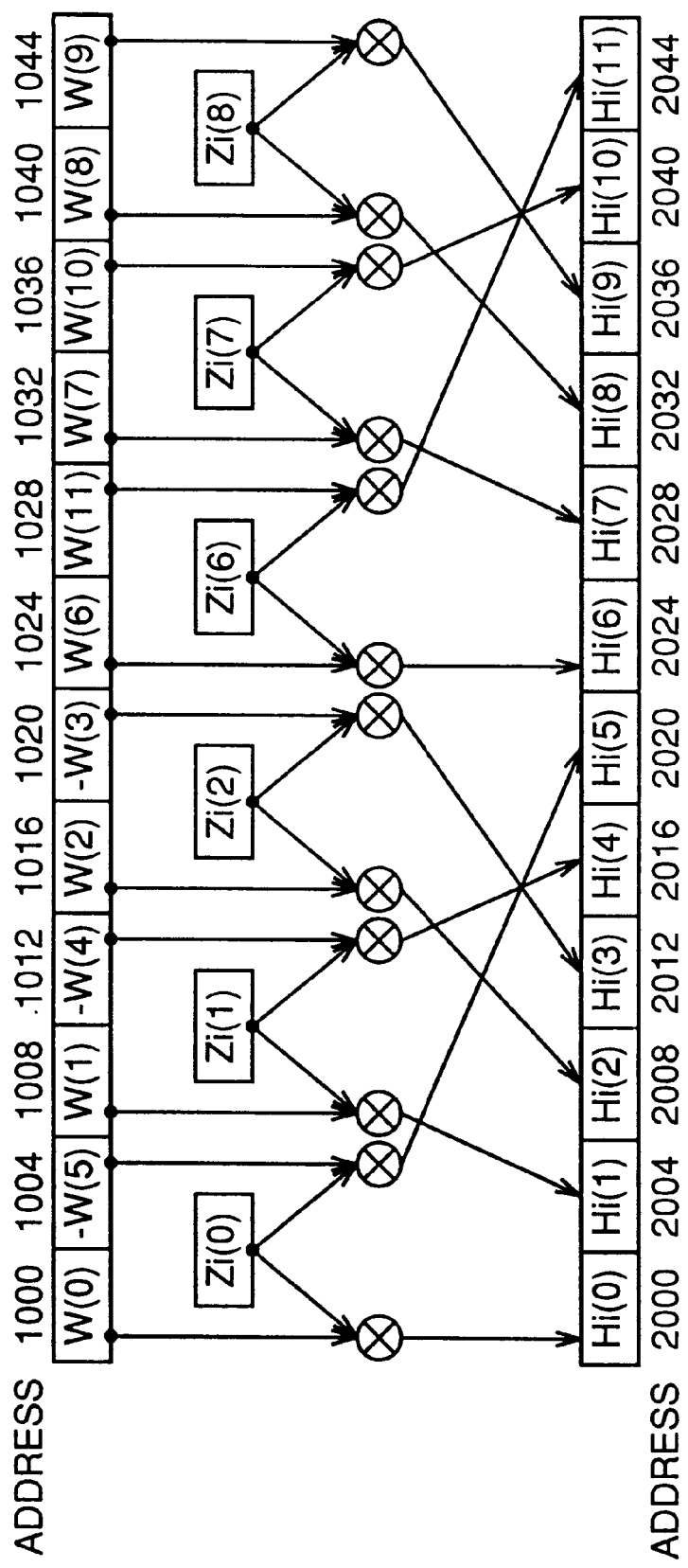
FIG. 18 shows a manner of performing fast windowing processing by the decoder for the audio data portion of MP3 according to the third embodiment.

In connection with the windowing processing (formula (5)) to be performed subsequently, one operation result of the IMDCT processing can be used for calculating the two windowing processing results. Accordingly, the window coefficient in the windowing processing is determined taking the position order and sign inversion into consideration. FIG. 18 shows an example in the case of N=12. From formula (15), formula (5) can be calculated as shown in the following formulas (16):

$$H_i(0) = W(0) \times Z_i(0), \quad H_i(5) = W(5) \times (-Z_i(0))$$
$$H_i(1) = W(1) \times Z_i(1), \quad H_i(4) = W(4) \times (-Z_i(1))$$
$$H_i(2) = W(2) \times Z_i(2), \quad H_i(3) = W(3) \times (-Z_i(2))$$
$$H_i(6) = W(6) \times Z_i(6), \quad H_i(11) = W(11) \times Z_i(6)$$
$$H_i(7) = W(7) \times Z_i(7), \quad H_i(10) = W(10) \times Z_i(7)$$
$$H_i(8) = W(8) \times Z_i(8), \quad H_i(9) = W(9) \times Z_i(8)$$
(16)

According to formulas (16), window coefficients W(n) are continuously stored in the order of W(0), −W(5), −W(1), −W(4), −W(2), −W(3), −W(6), −W(11), −W(7), −W(10), −W(8) and −W(9) on the memory, taking also the sign inversion into consideration, as shown in FIG. 18.

Thereby, the window coefficients are continuously read out so that fast access to the memory is achieved, resulting in increase in processing speed. According to formulas (16), H(n) is calculated in the order of $H_i(0)$, $H_i(5)$, $H_i(1)$, $H_i(4)$, $H_i(2)$, $H_i(3)$, $H_i(6)$, $H_i(11)$, $H_i(7)$, $H_i(10)$, $H_i(8)$ and $H_i(9)$. IMDCT operating portion 150 stores them in the memory such that they are in the original order obtained by calculation according to formula (5) (i.e., in the order of $H_i(0)$, $H_i(1)$, $H_i(2)$, $H_i(3)$, $H_i(4)$, $H_i(5)$, $H_i(6)$, $H_i(7)$, $H_i(8)$, $H_i(9)$, $H_i(10)$ and $H_i(11)$).

As described above, the decoder according to this embodiment can perform the IMDCT processing fast.

Naturally, the IMDCT processing in this embodiment can be used as IMDCT processing in IMDCT operating portion 27 according to the first embodiment which has been described with reference to FIG. 5.

The decoder according to this embodiment can be achieved by a computer, in which case the processing to be performed by the decoder is executed by a CPU, and the results of operations by the respective processing portions are stored in the memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An MPEG-1 audio layer III decoding device comprising:

a bit stream decomposing portion for decomposing an input bit stream of MPEG-1 audio layer III into side information including bit allocation information and Huffman table information, a scale factor and Huffman code data;

a scale factor decoder connected to said bit stream decomposing portion, for decoding said scale factor decomposed from the bit-stream based on said side information;

a Huffman decoder connected to said bit stream decomposing portion, for decoding said Huffman code data decomposed from the bit-stream based on said Huffman table information included in said side information;

a zero detecting portion connected to said Huffman decoder, for detecting a band of said Huffman code data all providing values of zero;

an inverse quantizer connected to said Huffman decoder, said zero detecting portion, said bit stream decomposing portion and said scale factor decoder, for performing inverse quantizing processing on said Huffman code data based on the output of said zero detecting portion, said side information, said scale factor and said Huffman code data; and a hybrid filter bank portion connected to said inverse quantizer, for inversely mapping the output of said inverse quantizer to decade into a time region signal.

2. The MPEG-1 audio layer III decoding device according to claim 1, wherein
said zero detecting portion includes:
a first zero detector connected to said Huffman decoder, for detecting the band of said Huffman code data all providing the values of zero, and
a second zero detector connected to said Huffman decoder, for detecting a band of said Huffman code data not coded in MPEG-1 audio layer III.

3. The MPEG-1 audio layer III decoding device according to claim 2, wherein
said hybrid filter bank portion includes:
a butterfly operating portion connected to said inverse quantizer, for performing a butterfly operation on the inversely quantized signal issued from said inverse quantizer,
an inverse modified discrete cosine transforming portion connected to said butterfly operating portion, for performing inverse modified discrete cosine transform processing on an operation result of said butterfly operating portion, and
a subband composing portion connected to said inverse modified discrete cosine transforming portion, for performing subband composing processing on the operation result of said inverse modified discrete cosine transforming portion using a polyphase filter bank.

4. The MPEG-1 audio layer III decoding device according to claim 3, wherein
said butterfly operating portion is connected to said second zero detector and performs the butterfly operation on said inversely quantized signal in accordance with the output of said second zero detector.

5. The MPEG-1 audio layer III decoding device according to claim 4, wherein
said inverse modified discrete cosine transforming portion is connected to said second zero detector and performs the inverse modified discrete cosine transform processing on the operation result of said butterfly operating portion in accordance with the output of said second zero detector.

6. The MPEG-1 audio layer III decoding device according to claim 4, wherein
said subband composing portion is connected to said second zero detector and performs the subband composing processing using the polyphase filter bank on the operation result of said inverse modified discrete cosine transforming portion in accordance with the output of said second zero detector.

7. The MPEG-1 audio layer III decoding device according to claim 3, wherein
said inverse modified discrete cosine transforming portion is connected to said second zero detector and performs the inverse modified discrete cosine transform processing on the operation result of said butterfly operating portion in accordance with the output of said second zero detector.

8. The MPEG-1 audio layer III decoding device according to claim 7, wherein
said subband composing portion is connected to said second zero detector and performs the subband composing processing using the polyphase filter bank on the operation result of said inverse modified discrete cosine transforming portion in accordance with the output of said second zero detector.

9. The MPEG-1 audio layer III decoding device according to claim 3, wherein
said subband composing portion is connected to said second zero detector and performs the subband composing processing using the polyphase filter bank on the operation result of said inverse modified discrete cosine transforming portion in accordance with the output of said second zero detector.

10. The MPEG-1 audio layer III decoding device according to claim 3, wherein
said hybrid filter bank portion further includes a third zero detector connected to said butterfly operating portion, for detecting a band of the operation results of said butterfly operating portion all providing values of zero, and
said inverse modified discrete cosine transforming portion is connected to said second and third zero detectors and performs inverse modified discrete cosine transform processing on the operation result of said butterfly operating portion in accordance with the outputs of said second and third zero detectors.

11. An MPEG-1 audio layer III decoding device comprising:
a bit stream decomposing portion for decomposing an input bit stream of MPEG-1 audio layer III into side information including bit allocation information and Huffman table information, a scale factor and Huffman code data;
a scale factor decoder connected to said bit stream decomposing portion, for decoding said scale factor decomposed from the bit-stream based on said side information;
a Huffman decoder connected to said bit stream decomposing portion, for decoding said Huffman code data decomposed from the bit-stream based on said Huffman table information included in said side information;
a first zero detector connected to said Huffman decoder, for detecting a band of the Huffman code data not coded in MPEG-1 audio layer III;
an inverse quantizer connected to said Huffman decoder, said bit stream decomposing portion and said scale factor decoder, for performing inverse quantizing processing on said Huffman code data based on said side information, said scale factor and said Huffman code data; and
a hybrid filter bank portion connected to said first zero detector and said inverse quantizer, for inversely mapping the output of said inverse quantizer to decode into a time region signal in accordance with the output of said first zero detector.

12. The MPEG-1 audio layer III decoding device according to claim 11, wherein
said hybrid filter bank portion includes:
a butterfly operating portion connected to said inverse quantizer, for performing a butterfly operation on the inversely quantized signal issued from said inverse quantizer,
an inverse modified discrete cosine transforming portion connected to said first zero detector and said butterfly operating portion, for performing inverse modified discrete cosine transform processing on the operation result of said butterfly operating portion in accordance with the output of said first zero detector, and
a subband composing portion connected to said inverse modified discrete cosine transforming portion, for performing subband composing processing using a polyphase filter bank on the operation result of said inverse modified discrete cosine transforming portion.

13. The MPEG-1 audio layer III decoding device according to claim 12, wherein
said hybrid filter bank portion further includes a second zero detector connected to said butterfly operating portion, for detecting a band of the operation results of said butterfly operating portion all providing values of zero, and
said inverse modified discrete cosine transforming portion is connected to said second zero detector and performs inverse modified discrete cosine transform processing on the operation result of said butterfly operating portion in accordance with the outputs of said first and second zero detectors.

14. The MPEG-1 audio layer III decoding device according to claim 11, wherein
said hybrid filter bank portion includes:
a butterfly operating portion connected to said first zero detector and said inverse quantizer, for performing a butterfly operation on the inversely quantized signal issued from said inverse quantizer in accordance with the output of said first zero detector,
an inverse modified discrete cosine transforming portion connected to said butterfly operating portion, for performing inverse modified discrete cosine transform processing on the operation result of said butterfly operating portion, and
a subband composing portion connected to said inverse modified discrete cosine transforming portion, for performing subband composing processing using a polyphase filter bank on the operation result of said inverse modified discrete cosine transforming portion.

15. The MPEG-1 audio layer III decoding device according to claim 11, wherein
said hybrid filter bank portion includes:
a butterfly operating portion connected to said inverse quantizer, for performing a butterfly operation on the inversely quantized signal issued from said inverse quantizer, an inverse modified discrete cosine transforming portion connected to said butterfly operating portion, for performing inverse modified discrete cosine transform processing on the operation result of said butterfly operating portion, and a subband composing portion connected to said first zero detector and said inverse modified discrete cosine transforming portion, for performing subband composing processing using a polyphase filter bank on the operation result of said inverse modified discrete cosine transforming portion in accordance with the output of said first zero detector.

16. An MPEG-1 audio layer III decoding device comprising:

a bit stream decomposing portion for decomposing an input bit stream of MPEG-1 audio layer III into side information including bit allocation information and Huffman table information, a scale factor and Huffman code data;

a scale factor decoder connected to said bit stream decomposing portion, for decoding said scale factor decomposed from the bit-stream based on said side information;

a Huffman decoder connected to said bit stream decomposing portion, for decoding said bit-stream-decomposed Huffman code data decomposed from the bit-stream based on said Huffman table information included in said side information;

an inverse quantizer connected to said Huffman decoder, said bit stream decomposing portion and said scale factor decoder, for performing inverse quantizing processing on said Huffman code data based on said side information, said scale factor and said Huffman code data;

a butterfly operating portion connected to said inverse quantizer, for performing a butterfly operation on the inversely quantized signal issued from said inverse quantizer;

an inverse modified discrete cosine transforming portion connected to said butterfly operating portion, for performing inverse modified discrete cosine transform processing on the operation result of said butterfly operating portion; and a subband composing portion connected to said inverse modified discrete cosine transforming portion, for performing subband composing processing using a polyphase filter bank on the operation result of said inverse modified discrete cosine transforming portion, wherein said inverse modified discrete cosine transforming portion includes:

a cumulative sum calculating portion connected to said butterfly operating portion, receiving the operation result of said butterfly operating portion, calculating a predetermined number of cumulative sums each formed of products of said operation results and a predetermined coefficient, and obtaining another predetermined number of cumulative sums from the predetermined number of cumulative sums, absolute values of the another predetermined number of cumulative sums are equal to values of the predetermined number of cumulative sums or negation of these, respectively, and a window function processing portion connected to said cumulative sum calculating portion for multiplying each of the cumulative sums with a window function selected in accordance with a predetermined rule.

17. A computer-readable recording medium with a program for making a computer function as an MPEG-1 audio layer III decoding device comprising:

a bit stream decomposing portion for decomposing an input bit stream of MPEG-1 audio layer III into side information including bit allocation information and Huffman table information, a scale factor and Huffman code data;

a scale factor decoder connected to said bit stream decomposing portion, for decoding said scale factor decomposed from the bit-stream based on said side information;

a Huffman decoder connected to said bit stream decomposing portion, for decoding said Huffman code data decomposed from the bit-stream based on said Huffman table information included in said side information;

a zero detecting portion connected to said Huffman decoder, for detecting a band of said Huffman code data all providing values of zero;

an inverse quantizer connected to said Huffman decoder, said zero detecting portion, said bit stream decomposing portion and said scale factor decoder, for performing inverse quantizing processing on said Huffman code data based on the output of said zero detecting portion, said side information, said scale factor and said Huffman code data; and a hybrid filter bank portion connected to said inverse quantizer, for inversely mapping the output of said inverse quantizer to decode into a time region signal.

18. The computer-readable recording medium according to claim 17, wherein said zero detecting portion includes:

a first zero detector connected to said Huffman decoder for detecting the band of said Huffman code data all providing the values of zero, and a second zero detector connected to said Huffman decoder, for detecting a band of said Huffman code data not coded in MPEG-1 audio layer III.

19. The computer-readable recording medium according to claim 18, wherein said hybrid filter bank portion includes:

a butterfly operating portion connected to said second zero detector and said inverse quantizer, for performing the butterfly operation on said inversely quantized signal in accordance with the output of said second zero detector, an inverse modified discrete cosine transforming portion connected to said butterfly operating portion, for performing inverse modified discrete cosine transform processing on an operation result of said butterfly operating portion, and a subband composing portion connected to said inverse modified discrete cosine transforming portion, for performing subband composing processing on the operation result of said inverse modified discrete cosine transforming portion using a polyphase filter bank.

20. The computer-readable recording medium according to claim 18, wherein said hybrid filter bank portion includes:

a butterfly operating portion connected to said inverse quantizer, for performing a butterfly operation on the inversely quantized signal issued from said inverse quantizer, an inverse modified discrete cosine transforming portion connected to said second zero detector and said butterfly operating portion, for performing the inverse modified discrete cosine transform processing on the operation result of said butterfly operating portion in accordance with the output of said second zero detector, and a subband composing portion connected to said inverse modified discrete cosine transforming portion, for performing subband composing processing on the operation result of said inverse modified discrete cosine transforming portion using a polyphase filter bank.

21. The computer-readable recording medium according to claim 18, wherein
said hybrid filter bank portion includes:
a butterfly operating portion connected to said inverse quantizer, for performing a butterfly operation on the inversely quantized signal issued from said inverse quantizer, an inverse modified discrete cosine transforming portion connected to said butterfly operating portion, for performing inverse modified discrete cosine transform processing on an operation result of said butterfly operating portion, and a subband composing portion connected to said second zero detector and said inverse modified discrete cosine transforming portion, for performing the subband composing processing using the polyphase filter bank on the operation result of said inverse modified discrete cosine transforming portion in accordance with the output of said second zero detector.

22. The computer-readable recording medium according to claim 18, wherein
said hybrid filter bank portion includes:
a butterfly operating portion connected to said inverse quantizer, for performing a butterfly operation on the inversely quantized signal issued from said inverse quantizer, a third zero detector connected to said butterfly operating portion, for detecting a band of the operation results of said butterfly operating portion all providing values of zero, an inverse modified discrete cosine transforming portion connected to said second and third zero detectors and said butterfly operating portion, for performing inverse modified discrete cosine transform processing on the operation result of said butterfly operating portion in accordance with the outputs of said second and third zero detectors, and a subband composing portion connected to said inverse modified discrete cosine transforming portion, for performing subband composing processing on the operation result of said inverse modified discrete cosine transforming portion using a polyphase filter bank.

23. A computer-readable recording medium with a program for making a computer function as an MPEG-1 audio layer III decoding device comprising:
a bit stream decomposing portion ,for decomposing an input bit stream of MPEG-1 audio layer III into side information including bit allocation information and Huffman table information, a scale factor and Huffman code data;

a scale factor decoder connected to said bit stream decomposing portion, for decoding said scale factor decomposed from the bit-stream based on said side information;

a Huffman decoder connected to said bit stream decomposing portion, for decoding said Huffman code data decomposed from the bit-stream based on said Huffman table information included in said side information;

a first zero detector connected to said Huffman decoder, for detecting a band of the Huffman code data not coded in MPEG-1 audio layer III;

an inverse quantizer connected to said Huffman decoder, said bit stream decomposing portion and said scale factor decoder, for performing inverse quantizing processing on said Huffman code data based on said side information, said scale factor and said Huffman code data; and a hybrid filter bank portion connected to said first zero detector and said inverse quantizer, for inversely mapping the output of said inverse quantizer to decode into a time region signal in accordance with the output of said first zero detector.

24. The computer-readable recording medium according to claim 23, wherein
said hybrid filter bank portion includes:
a butterfly operating portion connected to said inverse quantizer, for performing a butterfly operation on the inversely quantized signal issued from said inverse quantizer, an inverse modified discrete cosine transforming portion connected to said first zero detector and said butterfly operating portion, for performing inverse modified discrete cosine transform processing on the operation result of said butterfly operating portion in accordance with the output of said first zero detector, and a subband composing portion connected to said inverse modified discrete cosine transforming portion, for performing subband composing processing using a polyphase filter bank on the operation result of said inverse modified discrete cosine transforming portion.

25. The computer-readable recording medium according to claim 24, wherein
said hybrid filter bank portion further includes a second zero detector connected to said butterfly operating portion, for detecting a band of the operation results of said butterfly operating portion all providing values of zero, and said inverse modified discrete cosine transforming portion is connected to said second zero detector and performs inverse modified discrete cosine transform processing on the operation result of said butterfly operating portion in accordance with the outputs of said first and second zero detectors.

26. The computer-readable recording medium according to claim 23, wherein
said hybrid filter bank portion includes:
a butterfly operating portion connected to said first zero detector and said inverse quantizer for performing a butterfly operation on the inversely quantized signal issued from said inverse quantizer in accordance with the output of said first zero detector, an inverse modified discrete cosine transforming portion connected to said butterfly operating portion, for performing inverse modified discrete cosine transform processing on the operation result of said butterfly operating portion, and a subband composing portion connected to said inverse modified discrete cosine transforming portion, for performing subband composing processing using a polyphase filter bank on the operation result of said inverse modified discrete cosine transforming portion.

27. The computer-readable recording medium according to claim 23, wherein said hybrid filter bank portion includes:
- a butterfly operating portion connected to said inverse quantizer, for performing a butterfly operation on the inversely quantized signal issued from said inverse quantizer,
- an inverse modified discrete cosine transforming portion connected to said butterfly operating portion, for performing inverse modified discrete cosine transform processing on the operation result of said butterfly operating portion, and
- a subband composing portion connected to said first zero detector and said inverse modified discrete cosine transforming portion, for performing subband composing processing using a polyphase filter bank on the operation result of said inverse modified discrete cosine transforming portion in accordance with the output of said first zero detector.

* * * * *